United States Patent
Takahashi et al.

(10) Patent No.: US 10,644,164 B2
(45) Date of Patent: *May 5, 2020

(54) OXIDE SEMICONDUCTOR FILM AND SEMICONDUCTOR DEVICE

(71) Applicant: Semiconductor Energy Laboratory Co., Ltd., Atsugi-shi, Kanagawa-ken (JP)

(72) Inventors: Masahiro Takahashi, Atsugi (JP); Kengo Akimoto, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/891,677

(22) Filed: Feb. 8, 2018

(65) Prior Publication Data

US 2018/0175207 A1  Jun. 21, 2018

Related U.S. Application Data

(63) Continuation of application No. 15/198,119, filed on Jun. 30, 2016, now Pat. No. 9,893,201, which is a
(Continued)

(30) Foreign Application Priority Data

Apr. 13, 2011 (JP) .................. 2011-089349

(51) Int. Cl.
*H01L 29/786* (2006.01)
*H01L 21/02* (2006.01)
(Continued)

(52) U.S. Cl.
CPC ........ *H01L 29/7869* (2013.01); *C01G 15/006* (2013.01); *G02F 1/1368* (2013.01);
(Continued)

(58) Field of Classification Search
None
See application file for complete search history.

(56) References Cited

U.S. PATENT DOCUMENTS 5,712,496 A  1/1998  Takahashi et al.
5,731,856 A  3/1998  Kim et al.
(Continued)

FOREIGN PATENT DOCUMENTS

CN  101162737 A  4/2008
CN  101310371 A  11/2008
(Continued)

OTHER PUBLICATIONS

Kamiya.T et al., "Carrier transport properties and electronic structures of amorphous oxide semiconductors: the present status", Solid State Physics, Sep. 1, 2009. vol. 44, No. 9, pp. 621-633, Agne Gijutsu Center.
(Continued)

*Primary Examiner* — Herve-Louis Y Assouman
(74) *Attorney, Agent, or Firm* — Robinson Intellectual Property Law Office; Eric J. Robinson

(57) ABSTRACT

To provide an oxide semiconductor film having stable electric conductivity and a highly reliable semiconductor device having stable electric characteristics by using the oxide semiconductor film. The oxide semiconductor film contains indium (In), gallium (Ga), and zinc (Zn) and includes a c-axis-aligned crystalline region aligned in the direction parallel to a normal vector of a surface where the oxide semiconductor film is formed. Further, the composition of the c-axis-aligned crystalline region is represented by $In_{1+\delta}Ga_{1-\delta}O_3(ZnO)_m$ ($0<\delta<1$ and $m=1$ to 3 are satisfied), and the composition of the entire oxide semiconductor film
(Continued)

including the c-axis-aligned crystalline region is represented by $In_xGa_yO_3(ZnO)_m$ ($0<x<2$, $0<y<2$, and $m=1$ to $3$ are satisfied).

17 Claims, 10 Drawing Sheets

Related U.S. Application Data continuation of application No. 13/438,206, filed on Apr. 3, 2012, now Pat. No. 9,478,668.

(51) Int. Cl.

| | | |
|---|---|---|
| *H01L 27/12* | (2006.01) | |
| *H01L 29/24* | (2006.01) | |
| *H01L 29/04* | (2006.01) | |
| *H01L 29/66* | (2006.01) | |
| *G02F 1/1368* | (2006.01) | |
| *G02F 1/1343* | (2006.01) | |
| *G02F 1/1362* | (2006.01) | |
| *C01G 15/00* | (2006.01) | |
| *H01L 27/32* | (2006.01) | |

(52) U.S. Cl.
CPC .. *G02F 1/134309* (2013.01); *G02F 1/136213* (2013.01); *H01L 21/02565* (2013.01); *H01L 21/02609* (2013.01); *H01L 27/1225* (2013.01); *H01L 27/1285* (2013.01); *H01L 29/045* (2013.01); *H01L 29/24* (2013.01); *H01L 29/66969* (2013.01); *H01L 29/78696* (2013.01); *C01P 2006/40* (2013.01); *G02F 2201/123* (2013.01); *H01L 27/3262* (2013.01)

(56) References Cited

U.S. PATENT DOCUMENTS

| | | | |
|---|---|---|---|
| 5,744,864 A | 4/1998 | Cillessen et al. |
| 5,849,612 A | 12/1998 | Takahashi et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,343 B2 | 3/2009 | Li et al. |
| 7,601,984 B2 | 10/2009 | Sano et al. |
| 7,635,440 B2 | 12/2009 | Hosono et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,791,072 B2 | 9/2010 | Kumomi et al. |
| 7,829,376 B1 | 11/2010 | Adekore et al. |
| 7,893,495 B2 | 2/2011 | Li et al. |
| 7,977,169 B2 | 7/2011 | Hirao et al. |
| 8,158,974 B2 | 4/2012 | Yano et al. |
| 8,202,365 B2 | 6/2012 | Umeda et al. |
| 8,203,144 B2 | 6/2012 | Hoffman et al. |
| 8,293,595 B2 | 10/2012 | Yamazaki et al. |
| 8,329,506 B2 | 12/2012 | Akimoto et al. |
| 8,343,800 B2 | 1/2013 | Umeda et al. |
| 8,363,365 B2 | 1/2013 | Fukuoka et al. |
| 8,502,221 B2 | 8/2013 | Yamazaki |
| 8,643,011 B2 | 2/2014 | Akimoto et al. |
| 8,647,031 B2 | 2/2014 | Hoffman et al. |
| 8,723,173 B2 | 5/2014 | Yamazaki et al. |
| 8,779,419 B2 | 7/2014 | Yano et al. |
| 8,822,263 B2 | 9/2014 | Koukitu et al. |
| 8,841,710 B2 | 9/2014 | Yamazaki et al. |
| 8,993,386 B2 | 3/2015 | Ohara et al. |
| 9,153,702 B2 | 10/2015 | Yamazaki et al. |
| 9,252,288 B2 | 2/2016 | Akimoto et al. |
| 9,412,798 B2 | 8/2016 | Yamazaki et al. |
| 9,478,668 B2 | 10/2016 | Takahashi et al. |
| 9,647,131 B2 | 5/2017 | Yamazaki et al. |
| 9,859,441 B2 | 1/2018 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0032443 A1* | 2/2008 | Wu .................. H01L 29/7869 438/104 |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1* | 10/2008 | Lee .................. H01L 21/02554 257/43 |
| 2008/0258141 A1 | 10/2008 | Park et al. |

(56) References Cited

U.S. PATENT DOCUMENTS

| | | |
|---|---|---|
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127552 A1 | 5/2009 | Li et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0189153 A1 | 7/2009 | Iwasaki et al. |
| 2009/0218572 A1 | 9/2009 | Dairiki et al. |
| 2009/0278122 A1 | 11/2009 | Hosono et al. |
| 2009/0280600 A1 | 11/2009 | Hosono et al. |
| 2010/0059747 A1 | 3/2010 | Nakayama et al. |
| 2010/0065835 A1 | 3/2010 | Inoue et al. |
| 2010/0065844 A1 | 3/2010 | Tokunaga |
| 2010/0072469 A1* | 3/2010 | Yamazaki ........... H01L 27/1225 257/43 |
| 2010/0090215 A1 | 4/2010 | Lee |
| 2010/0092800 A1 | 4/2010 | Itagaki et al. |
| 2010/0109002 A1 | 5/2010 | Itagaki et al. |
| 2010/0127266 A1 | 5/2010 | Saito et al. |
| 2010/0187524 A1 | 7/2010 | Isobe et al. |
| 2010/0233847 A1 | 9/2010 | Ohara et al. |
| 2010/0295041 A1 | 11/2010 | Kumomi et al. |
| 2010/0314618 A1 | 12/2010 | Tanaka et al. |
| 2010/0320458 A1* | 12/2010 | Umeda ................ C01G 15/006 257/43 |
| 2011/0062436 A1 | 3/2011 | Yamazaki et al. |
| 2014/0070211 A1 | 3/2014 | Iwasaki et al. |
| 2015/0194509 A1 | 7/2015 | Ohara et al. |

FOREIGN PATENT DOCUMENTS

| | | |
|---|---|---|
| CN | 101931009 A | 12/2010 |
| CN | 102498553 A | 6/2012 |
| EP | 1737044 A | 12/2006 |
| EP | 1921681 A | 5/2008 |
| EP | 2149910 A | 2/2010 |
| EP | 2149911 A | 2/2010 |
| EP | 2226847 A | 9/2010 |
| EP | 2406826 A | 1/2012 |
| EP | 2478554 A | 7/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-023101 A | 1/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| JP | 2007-073697 A | 3/2007 |
| JP | 2007-281409 A | 10/2007 |
| JP | 2008-098637 A | 4/2008 |
| JP | 2008-277665 A | 11/2008 |
| JP | 2009-167087 A | 7/2009 |
| JP | 2010-028109 A | 2/2010 |
| JP | 2010-040552 A | 2/2010 |
| JP | 2010-056546 A | 3/2010 |
| JP | 2010-067849 A | 3/2010 |
| JP | 2010-135777 A | 6/2010 |
| JP | 2010-153802 A | 7/2010 |
| JP | 2011-003856 A | 1/2011 |
| JP | 2011-009697 A | 1/2011 |
| JP | 2011-029238 A | 2/2011 |
| JP | 2011-086923 A | 4/2011 |
| KR | 2006-0132720 A | 12/2006 |
| KR | 2010-232623 A | 10/2010 |
| KR | 2011-0033056 A | 3/2011 |
| KR | 2012-0056870 A | 6/2012 |
| TW | 201104759 | 2/2011 |
| TW | 201207997 | 2/2012 |
| TW | I538886 | 6/2016 |
| WO | WO-2004/114391 | 12/2004 |
| WO | WO-2005/093850 | 10/2005 |
| WO | WO-2007/032294 | 3/2007 |
| WO | WO-2007/094501 | 8/2007 |
| WO | WO-2008/117739 | 10/2008 |
| WO | WO-2010/103935 | 9/2010 |
| WO | WO-2011/033936 | 3/2011 |

OTHER PUBLICATIONS

Nakamura.M et al., "Syntheses and crystal structures of new homologous compounds, indium iron zinc oxides (InFeO3(ZnO)m) (m natural number) and related compounds", Kotai Bejtsuri (Solid State Physics), 1993, vol. 28, No. 5, pp. 317-327.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9. and 16) in the In2O3—ZnGa2O4—ZnO System", Journal of Solid State Chemistry, Apr. 1, 1995. vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:the "Blue Phase"", Physics Letters, Sep. 10, 1973, vol. 45A. No. 2, pp. 115-116.
Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AMOLED Driven by Peald Grown ZNO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1330-1333.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the IN2O3 and SC2O3—A2O3—BO Systems [A; Fe, Ga or Al; B: Mg, Mn, Fe, Ni, Cu,or Zn] at Temperatures Over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED

(56) References Cited

OTHER PUBLICATIONS

Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B. (Physical Review. B), 2003, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B, Mar. 1, 2003, vol. 21, No, 2, pp. 800-803.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Taiwanese Office Action (Application No. 101112466) dated Jun. 17, 2015.

Chinese Office Action (Application No. 201210103353.5) dated Dec. 3, 2015.

Taiwanese Office Action (Application No. 105110306) dated Jan. 23, 2017.

Korean Office Action (Application No. 2012-0037910) dated Jul. 13, 2018.

Chinese Office Action (Application No. 201610663376.X) dated Jul. 24, 2018.

\* cited by examiner

※: lower than the lower limit of the detection (1.0E+17)

OXIDE SEMICONDUCTOR FILM AND SEMICONDUCTOR DEVICE

BACKGROUND OF THE INVENTION

1. Field of the Invention

The present invention relates to an oxide semiconductor film and a semiconductor device including the oxide semiconductor film.

Note that the semiconductor device in this specification refers to all devices that can function by utilizing semiconductor characteristics, and electro-optic devices, semiconductor circuits, and electronic appliances are all semiconductor devices.

2. Description of the Related Art

Transistors formed over a glass substrate or the like are manufactured using amorphous silicon, polycrystalline silicon, or the like, as typically seen in liquid crystal display devices. A transistor manufactured using amorphous silicon can easily be formed over a larger glass substrate. However, a transistor manufactured using amorphous silicon has a disadvantage of low field-effect mobility. Although a transistor manufactured using polycrystalline silicon has high field-effect mobility, it has a disadvantage of not being suitable for a larger glass substrate.

In contrast to a transistor manufactured using silicon with disadvantages as described above, a technique in which a transistor is manufactured using an oxide semiconductor and applied to an electronic device or an optical device has attracted attention. For example, Patent Document 1 discloses a technique in which a transistor is manufactured using an amorphous oxide containing In, Zn, Ga, Sn, and the like as an oxide semiconductor. In addition, Patent Document 2 discloses a technique in which a transistor similar to that in Patent Document 1 is manufactured and used as a switching element or the like in a pixel of a display device.

In addition, as for such an oxide semiconductor used in a transistor, there is also description as follows: an oxide semiconductor is insensitive to impurities, there is no problem when a considerable amount of metal impurities are contained in a film, and soda-lime glass which contains a large amount of alkali metals such as sodium and is inexpensive can also be used (see Non-Patent Document 1).

REFERENCE

Patent Document

[Patent Document 1] Japanese Published Patent Application No. 2006-165529
[Patent Document 2] Japanese Published Patent Application No. 2006-165528
[Non-Patent Document 1] Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633

SUMMARY OF THE INVENTION

However, when an oxide semiconductor film remains amorphous, an oxygen vacancy or a dangling bond is likely to be generated in the oxide semiconductor film and carriers are generated in the film by the oxygen vacancy or dangling bond alone or in combination with hydrogen or the like. Therefore, electric characteristics of the oxide semiconductor film, such as the electric conductivity, might change. Such a phenomenon changes the electric characteristics of a transistor including the oxide semiconductor film, which leads to a reduction in reliability of the semiconductor device.

In view of the above problems, it is an object to provide an oxide semiconductor film which has stable electric characteristics. It is another object to provide a highly reliable semiconductor device which has stable electric characteristics by using the oxide semiconductor film.

One embodiment of the disclosed invention is an oxide semiconductor film which contains indium, gallium, and zinc and includes a c-axis-aligned crystalline region. Unlike an oxide semiconductor film which is entirely amorphous, the oxide semiconductor film according to one embodiment of the disclosed invention includes the c-axis-aligned crystalline region; therefore, in the oxide semiconductor film, oxygen vacancies, dangling bonds, or impurities such as hydrogen, boron, nitrogen, and phosphorus bonded to dangling bonds or the like are reduced, and thus the oxide semiconductor film is highly purified. Further, the composition of the c-axis-aligned crystalline region and the composition of the entire oxide semiconductor film including the c-axis-aligned crystalline region is determined, whereby the oxide semiconductor film can have a stable crystalline structure. Details thereof will be described below.

Another embodiment of the disclosed invention is an oxide semiconductor film which contains indium (In), gallium (Ga), and zinc (Zn) and includes a c-axis-aligned crystalline region aligned in the direction parallel to a normal vector of a surface where the oxide semiconductor film is formed. Further, the composition of the c-axis-aligned crystalline region is represented by $In_{1+\delta}Ga_{1-\delta}O_3(ZnO)_m$ ($0<\delta<1$ and $m=1$ to 3 are satisfied), and the composition of the entire oxide semiconductor film including the c-axis-aligned crystalline region is represented by $In_xGa_yO_3(ZnO)_m$ ($0<x<2$, $0<y<2$, and $m=1$ to 3 are satisfied).

Another embodiment of the disclosed invention is a semiconductor device including a gate electrode; a first insulating film provided in contact with the gate electrode; an oxide semiconductor film provided in contact with the first insulating film; and a second insulating film provided in contact with the oxide semiconductor film. The oxide semiconductor film contains indium (In), gallium (Ga), and zinc (Zn), and includes a c-axis-aligned crystalline region aligned in the direction parallel to a normal vector of a surface where the oxide semiconductor film is formed. The composition of the c-axis-aligned crystalline region is represented by $In_{1+\delta}Ga_{1-\delta}O_3(ZnO)_m$ ($0<\delta<1$ and $m=1$ to 3 are satisfied), and the composition of the entire oxide semiconductor film including the c-axis-aligned crystalline region is represented by $In_xGa_yO_3(ZnO)_m$ ($0<x<2$, $0<y<2$, and $m=1$ to 3 are satisfied).

In each of the above-described structures, it is preferable that the total impurity concentration of boron (B), phosphorus (P), and nitrogen (N) contained in the oxide semiconductor film be lower than or equal to $5 \times 10^{19}$ atoms/cm$^3$, the concentration of any one of boron (B), phosphorus (P), and nitrogen (N) contained in the oxide semiconductor film be lower than or equal to $1 \times 10^{19}$ atoms/cm$^3$, the concentrations of lithium (Li) and potassium (K) contained in the oxide semiconductor film be lower than or equal to $5 \times 10^{15}$ atoms/cm$^3$, and the concentration of sodium (Na) contained in the oxide semiconductor film be lower than or equal to $5 \times 10^{16}$ atoms/cm$^3$.

An oxide semiconductor film which contains indium, gallium, and zinc disclosed in one embodiment of the present invention can have stable electric characteristics. By using such an oxide semiconductor film which contains indium, gallium, and zinc for a transistor, a highly reliable semiconductor device having stable electric characteristics can be provided.

DETAILED DESCRIPTION OF THE INVENTION

Figure 1A:
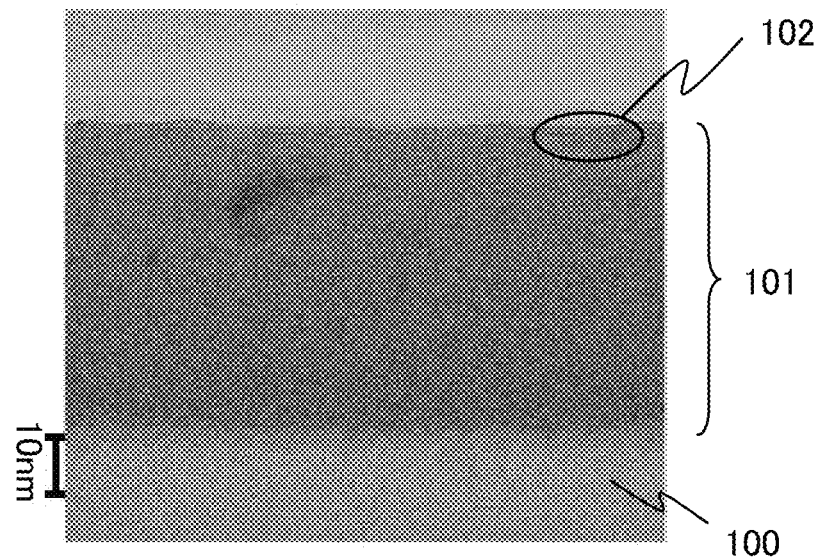
FIGS. 1A and 1B are cross-sectional TEM images of an oxide semiconductor film according to one embodiment of the present invention.

Embodiments and an example of the present invention will be described with reference to the drawings. Note that the present invention is not limited to the following description, and it will be easily understood by those skilled in the art that various changes and modifications can be made without departing from the spirit and scope of the invention. Accordingly, the present invention should not be construed as being limited to the description of the embodiments and example to be given below. Note that in structures of the present invention described hereinafter, like portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, the embodiments and example of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

In this embodiment, a structure of an oxide semiconductor film which contains indium (In), gallium (Ga), and zinc (Zn) will be described with reference to FIGS. 1A and 1B, FIG. 2, and FIGS. 3A and 3B.

An oxide semiconductor film according to this embodiment which contains indium (In), gallium (Ga), and zinc (Zn) includes a c-axis-aligned crystalline region aligned in the direction parallel to a normal vector of a surface where the oxide semiconductor film is formed. The composition of the c-axis-aligned crystalline region is represented by $In_{1+\delta}Ga_{1-\delta}O_3(ZnO)_m$ ($0<\delta<1$ and $m=1$ to 3 are satisfied). The composition of the entire oxide semiconductor film including the c-axis-aligned crystalline region is represented by $In_xGa_yO_3(ZnO)_m$ ($0<x<2$, $0<y<2$, and $m=1$ to 3 are satisfied).

Figure 1B:
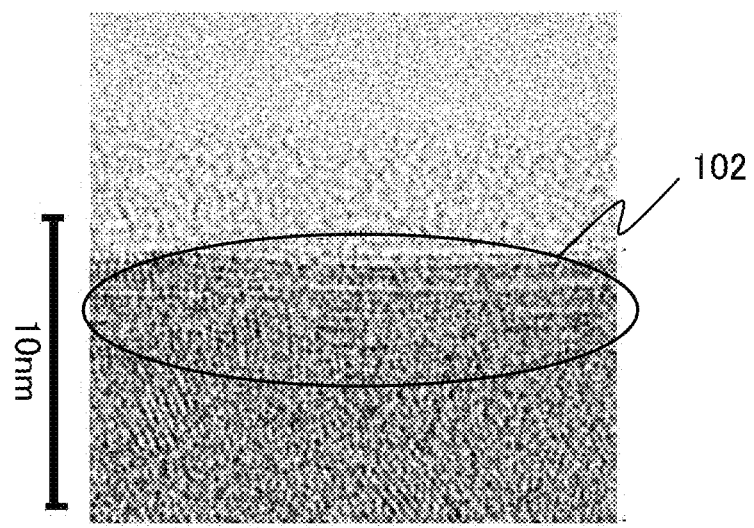

An oxide semiconductor film was actually formed, and a cross section thereof was observed with a TEM (transmission electron microscope). FIGS. 1A and 1B (cross-sectional TEM images) show the results.

A sample shown in the cross-sectional TEM image of FIG. 1A was obtained as follows. An oxide semiconductor film 101 was deposited over a substrate 100 to a thickness of 50 nm at a room temperature with the use of a metal oxide target containing indium (In), gallium (Ga), and zinc (Zn) (with a composition ratio of In:Ga:Zn=1:1:1 [atomic ratio]) by a sputtering method, and after that a heat treatment was performed on the oxide semiconductor film 101 at 700° C. for an hour under an oxygen atmosphere. It is found from the cross-sectional TEM image shown in FIG. 1A that an upper portion of the oxide semiconductor film 101 has a crystalline region 102. Note that the cross-sectional TEM image shown in FIG. 1B is an enlarged image of the crystalline region 102 shown in FIG. 1A.

In the cross-sectional TEM images shown in FIGS. 1A and 1B, a plurality of crystalline regions 102 where atoms are arranged in a layered manner in the oxide semiconductor film 101 are observed in the oxide semiconductor film containing indium (In), gallium (Ga), and zinc (Zn).

Next, the spacing between lattice planes where atoms are arranged in a layered manner was calculated using the cross-sectional TEM image shown in FIG. 1B. The spacing between the lattice planes in a direction parallel to a normal vector of the surface where the oxide semiconductor film 101 is formed was found to be 0.288 nm. Note that the spacing between the lattice planes was calculated by fast fourier transform mapping (FFTM) method.

Figure 2:
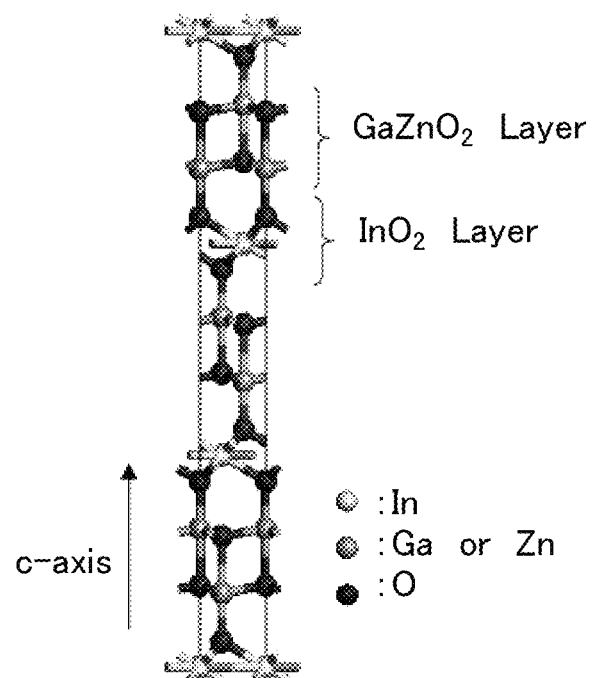
FIG. 2 is a diagram illustrating a crystalline structure of an oxide semiconductor film according to one embodiment of the present invention.

Here, an In—Ga—Zn—O film, which is an example of the oxide semiconductor film which contains indium (In), gallium (Ga), and zinc (Zn), has a crystal structure in which an InO layer and a GaO layer or a ZnO layer are stacked in a layered manner in the c-axis direction. As an example of such a crystal structure, a structure where the lattice constant c is 2.607 nm in the composition of $InGaO_3$ (ZnO) can be given. FIG. 2 is a schematic diagram of a crystal structure of an In—Ga—Zn—O film. In FIG. 2, a white circle indicates indium (In), a gray circle indicates gallium (Ga) or zinc (Zn), and a black circle indicates oxygen (O). As shown in FIG. 2, an $InO_2$ layer and a $GaZnO_2$ layer are stacked in the c-axis direction as a layer including a bond with a hexagonal lattice. Note that the c-axis direction is perpendicular to the a-b plane.

Figure 3A:
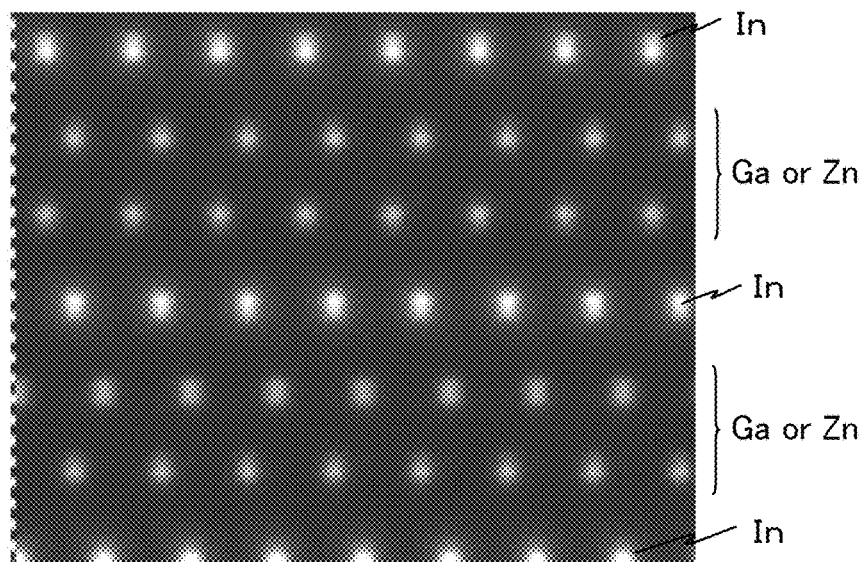
FIG. 3A is a schematic view of an oxide semiconductor film according to an embodiment of the present invention.

Next, calculation was performed based on the crystal structure shown in FIG. 2. FIG. 3A is a schematic diagram obtained by the calculation. Further, FIG. 3B is a further enlarged cross-sectional TEM image of the crystalline region 102 shown in FIG. 1B.

In FIG. 3A, the contrast of the image is proportional to the square of an atomic number, and a white circle indicates In and a gray circle indicates Ga or Zn. In FIG. 3B, a region that seems to be a black layer indicates an InO layer, and a region positioned between adjacent black layers indicates a GaO layer or a ZnO layer.

Figure 3B:
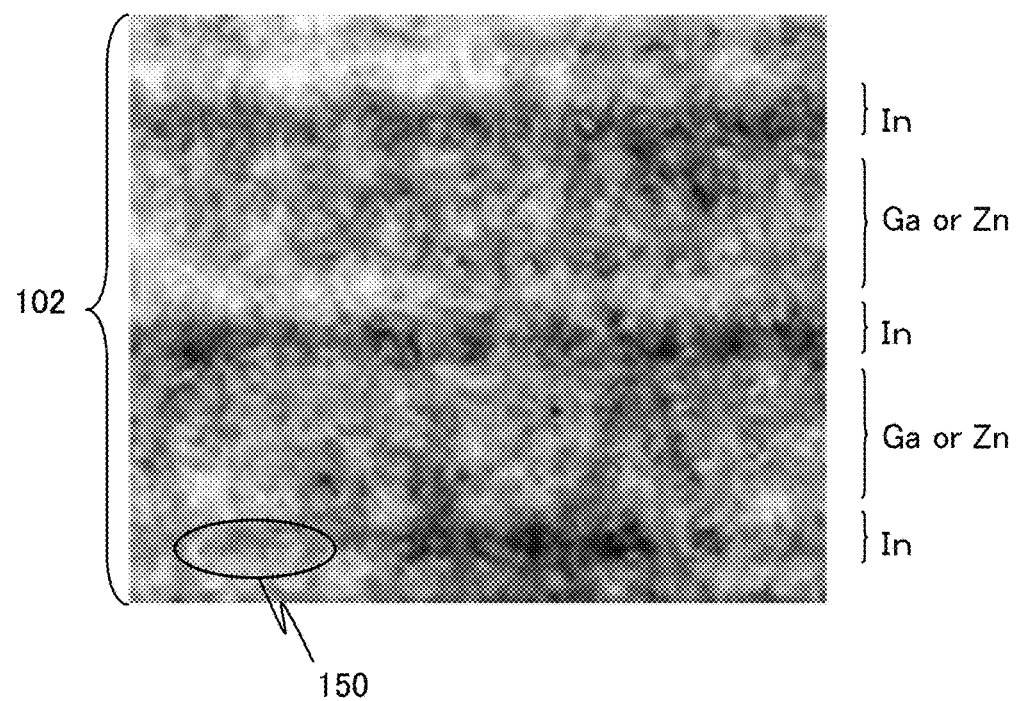
FIG. 3B is a cross-sectional TEM image of an oxide semiconductor film according to one embodiment of the present invention.

In this manner, it is found that the arrangement of atoms of the crystalline region 102 in the schematic diagram of FIG. 3A is substantially the same as that in the cross-sectional TEM image of FIG. 3B. In other words, the crystalline region 102 shown in FIGS. 1A and 1B and FIG. 3B has the crystal structure shown in FIG. 2.

The spacing between adjacent (001) planes, which is one of unit cells in the c-axis direction corresponds to the lattice constant c in the c-axis direction which is 2.607 nm. Accordingly, the spacing between (009) planes corresponds to d=0.2897 nm. In other words, the spacing between planes in the direction parallel to a normal vector of a surface where a crystal plane of the crystalline region 102 of FIG. 1B where atoms are arranged in a layered manner is formed is 0.288 nm, which is substantially the same as the spacing d between the (009) planes which is 0.2897 nm. Accordingly, it is found that the crystalline region 102 has a crystal structure of InGaZnO$_4$. In other words, the composition of the crystalline region 102 is In:Ga:Zn=1:1:1 (atomic ratio).

From the above, as shown in the cross-sectional TEM images of FIGS. 1A and 1B and FIG. 3B, the crystalline region 102 has a c-axis alignment and a triangular or hexagonal atomic arrangement when seen from the direction perpendicular to the a-b plane. In the crystalline region 102, metal atoms are arranged in a layered manner, or metal atoms and oxygen atoms are arranged in a layered manner along the c-axis, and the direction of the a-axis or the b-axis is varied in the a-b plane (the crystal rotates around the c-axis). In this specification and the like, the oxide semiconductor film including such a crystalline region is referred to as a c-axis aligned crystalline oxide semiconductor (CAAC-OS) film.

In a broad sense, an CAAC-OS film means a non-single-crystal material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS film is not a single crystal film, but this does not mean that the CAAC-OS film is composed of only an amorphous component. Although the CAAC-OS film includes a crystallized portion (crystalline portion) or a crystallized region (crystalline region), a boundary between one crystalline portion and another crystalline portion or a boundary between one crystalline region and another crystalline region is not clear in some cases.

Nitrogen may be substituted for part of oxygen included in the CAAC-OS film. Further, the c-axes of individual crystalline portions included in the CAAC-OS film may be aligned in one direction (e.g., a direction parallel to a normal vector of the surface where the CAAC-OS film is formed or a normal vector of a surface of the CAAC-OS film). Alternatively, the normal vectors of the a-b planes of the individual crystalline portions included in the CAAC-OS film may be aligned in one direction (e.g., a direction perpendicular to a normal vector of the surface where the CAAC-OS film is formed or a direction perpendicular to a normal vector of a surface of the CAAC-OS film).

Such a CAAC-OS film can be formed using a material where the c-axis is aligned in a direction parallel to a normal vector of the surface where the CAAC-OS film is formed or a direction parallel to a normal vector of a surface of the CAAC-OS film, which has a triangular or hexagonal atomic arrangement when observed from the direction perpendicular to the a-b plane, and in which metal atoms are arranged in a layered manner or metal atoms and oxygen atoms (or nitrogen atoms) are arranged in a layered manner when a cross section of the film is observed.

Here, a stoichiometric composition ratio of the oxide semiconductor film which contains indium (In), gallium (Ga), and zinc (Zn) will be considered. In and Ga are trivalent, and Zn is divalent. For example, even when In is substituted by Ga, the valence is not changed because both In and Ga are trivalent. Further, the amount of Ga can be reduced and the amount of In can be increased without changing the crystalline structure.

In other words, the stoichiometric composition ratio of the oxide semiconductor film containing indium (In), gallium (Ga), and zinc (Zn) is represented by $In_{1+\delta}Ga_{1-\delta}O_3(ZnO)_m$ ($0<\delta<1$ and m=1 to 3 are satisfied), and even when the composition ratio of In and Ga deviates from the stoichiometric composition ratio, a stable crystalline structure can be kept.

It can be confirmed that In and Ga are partly substituted in the crystalline structure shown in FIG. 3B. In a region 150 of the crystalline region 102, continuity of the continuous crystal structure of In (the region that seems to be a black layer) is partly changed. Further, the contrast of the region 150 is very similar to that of Ga or Zn, and when substitution by Zn is performed, the valence is changed, and thus the crystalline structure cannot be kept; therefore, it is indicated that substitution by Ga is performed.

Next, Table 1 shows results of analyzing the composition of the oxide semiconductor film 101 which includes the c-axis-aligned crystalline region 102. Note that the composition analysis was performed by inductively coupled plasma mass spectrometry (ICP-MS). Each element in the oxide semiconductor film 101 is represented by atomic %. Further, the amount of oxygen (O) is calculated on the assumption that oxides are contained in the oxide semiconductor film 101 as $In_2O_3$, $Ga_2O_3$ and ZnO, which are ideal compositions.

TABLE 1

|  | In | Ga | Zn | O |
|---|---|---|---|---|
| Oxide semiconductor film 101 | 15.8 | 15.6 | 10.7 | 57.9 |

Here, when the oxide semiconductor film 101 shown in Table 1 is normalized by In, the composition shown in Table 2 is obtained.

TABLE 2

|  | In | Ga | Zn | O |
|---|---|---|---|---|
| Oxide semiconductor film 101 | 1.00 | 0.99 | 0.68 | 3.66 |

In Table 2, the composition ratio of In to Ga and Zn in the oxide semiconductor film 101 including the c-axis-aligned crystalline region 102 is substantially 1:1:0.7 (=In:Ga:Zn) (atomic %). Accordingly, the oxide semiconductor film 101 which includes the c-axis-aligned crystalline region 102 may have a different structure from an In—Ga—Zn—O-based oxide semiconductor film represented by $InGaO_3(ZnO)_n$ (n is a natural number). In other words, the oxide semiconductor film 101 which includes the c-axis-aligned crystalline region 102 is represented by $In_xGa_yO_3(ZnO)_m$ (0<x<2, 0<y<2, and m=1 to 3 are satisfied).

As described above, the composition ratio of the c-axis-aligned crystalline region 102 is different from that of the oxide semiconductor film 101 which includes the c-axis-aligned crystalline region 102. In other words, the c-axis-aligned crystalline region 102 may have a different composition ratio from the entire oxide semiconductor film 101. This may be because the composition ratio of the oxide semiconductor film 101 is changed by a temperature at which the oxide semiconductor film 101 was formed, a heat treatment performed after formation of the oxide semiconductor film 101, or the like.

However, even when the composition ratio of the entire oxide semiconductor film 101 is changed, a stable crystalline structure is kept in the c-axis-aligned crystalline region 102; therefore, the oxide semiconductor film 101 can have a stable crystalline structure.

Further, the impurity concentration in the oxide semiconductor film 101 which includes the c-axis-aligned crystalline region 102 is low. Specifically, the total impurity concentration of phosphorus (P), boron (B), and nitrogen (N), which are n-type impurities, can be preferably lower than or equal to $5 \times 10^{19}$ atoms/cm$^3$, more preferably, lower than or equal to $5 \times 10^{18}$ atoms/cm$^3$.

Further, the concentration of any one of phosphorus (P), boron (B), and nitrogen (N) which are n-type impurities and contained in the oxide semiconductor film 101 can be preferably lower than or equal to $1.0 \times 10^{19}$ atoms/cm$^3$, more preferably, lower than or equal to $1.0 \times 10^{18}$ atoms/cm$^3$.

This is because the c-axis-aligned crystalline region 102 has a stable crystalline structure, and thus, oxygen vacancies, dangling bonds, or impurities such as hydrogen, boron, nitrogen, and phosphorus bonded to dangling bonds or the like in the oxide semiconductor film 101 are reduced.

Here, the concentrations of phosphorus (P), boron (B), and nitrogen (N) which are impurities in the oxide semiconductor film 101 of FIGS. 1A and 1B formed actually were measured. Note that the measurement of the impurity concentrations was performed by secondary ion mass spectrometry (SIMS).

It was found that as results of the SIMS analysis, the concentration of phosphorus (P) was lower than or equal to $4.0 \times 10^{16}$ atoms/cm$^3$, the concentration of boron (B) was lower than or equal to $4.0 \times 10^{17}$ atoms/cm$^3$, the concentration of nitrogen (N) was lower than or equal to $1.0 \times 10^{17}$ atoms/cm$^3$, and the total concentration of all the impurities was lower than or equal to $4.5 \times 10^{16}$ atoms/cm$^3$.

In this manner, impurities that might impart n-type conductivity are removed thoroughly from the oxide semiconductor film 101, whereby the oxide semiconductor film 101 can be highly purified.

Further, in the oxide semiconductor film which contains indium (In), gallium (Ga), and zinc (Zn), other than the concentrations of phosphorus (P), boron (B), and nitrogen (N), which are the above-described impurities, the concentration of an impurity such as an alkali metal is also preferably reduced. For example, in the oxide semiconductor film, the concentration of lithium is lower than or equal to $5 \times 10^{15}$ atoms/cm$^3$, preferably lower than or equal to $1 \times 10^{15}$ atoms/cm$^3$; the concentration of sodium is lower than or equal to $5 \times 10^{16}$ atoms/cm$^3$, preferably lower than or equal to $1 \times 10^{16}$ atoms/cm$^3$; the concentration of potassium is lower than or equal to $5 \times 10^{15}$ atoms/cm$^3$, preferably lower than or equal to $1 \times 10^{15}$ atoms/cm$^3$.

An alkali metal and an alkaline earth metal are adverse impurities for the oxide semiconductor and are preferably contained as little as possible. In particular, when the oxide semiconductor film is used for a transistor, sodium among alkali metals is diffused into an insulating film in contact with the oxide semiconductor film, which may cause fluctuation in the threshold voltage of the transistor, or the like. In addition, in the oxide semiconductor film, sodium cleaves a bond between metal and oxygen or is inserted between the metal-oxygen bond. As a result, transistor characteristics deteriorate (e.g., the transistor becomes normally-on (the shift of a threshold voltage to a negative side) or the mobility is decreased). In addition, this also causes variation in the characteristics.

Accordingly, it is preferable that impurities in the oxide semiconductor film which includes the c-axis-aligned crystalline region be extremely reduced, the concentration of an alkali metal be lower than or equal to $5 \times 10^{16}$ atoms/cm$^3$, and the concentration of hydrogen be lower than or equal to $5 \times 10^{19}$ atoms/cm$^3$.

The oxide semiconductor film which contains indium (In), gallium (Ga), and zinc (Zn) includes the c-axis-aligned crystalline region, whereby it has favorable crystallinity unlike an oxide semiconductor film which is entirely amorphous; therefore, oxygen vacancies, dangling bonds, or impurities such as hydrogen, boron, nitrogen, and phosphorus bonded to dangling bonds or the like are reduced.

An oxygen vacancy, a dangling bond, or an impurity bonded to a dangling bond or the like functions as a carrier trap or a source for supplying a carrier in the oxide semiconductor film, which might change the electric conductivity of the oxide semiconductor film.

Therefore, the oxide semiconductor film which contains indium (In), gallium (Ga), and zinc (Zn) and includes the c-axis-aligned crystalline region can have stable electric conductivity and can be electrically stable with respect to irradiation with visible light, ultraviolet light, and the like.

Further, in the oxide semiconductor film which contains indium (In), gallium (Ga), and zinc (Zn), the composition of the c-axis-aligned crystalline region and the composition of the entire oxide semiconductor film including the c-axis-aligned crystalline region are determined. The c-axis-aligned crystalline region can be stable even when the composition ratio of the c-axis-aligned crystalline region deviates from the stoichiometric composition ratio. By determining each composition like this, the oxide semiconductor film having a stable crystalline structure can be obtained.

The structures and the like described in this embodiment can be combined as appropriate with any of the structures, methods, and the like described in other embodiments.

Embodiment 2

In this embodiment, a method for forming the oxide semiconductor film which contains indium, gallium, and zinc and includes the c-axis-aligned crystalline region, described in Embodiment 1, and a method for manufacturing a transistor including the oxide semiconductor film will be described with reference to FIGS. 4A to 4E and FIG. 5.

Figure 4A:
FIGS. 4A to 4E are cross-sectional views illustrating a manufacturing process of a semiconductor device according to one embodiment of the present invention.
Figure 4B:
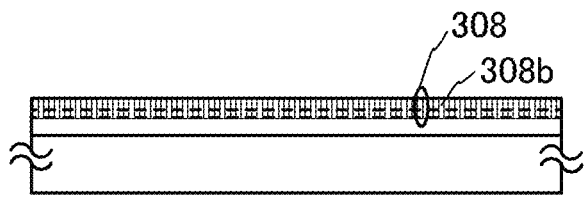
Figure 4C:
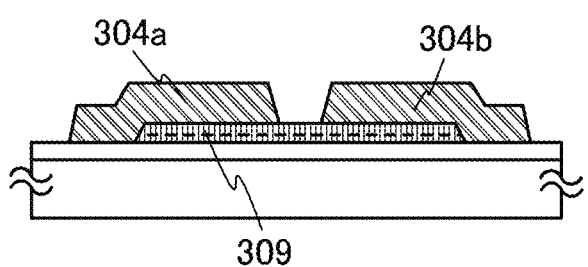
Figure 4D:
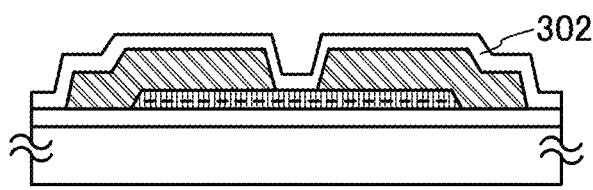

FIGS. 4A to 4E are cross-sectional views illustrating a manufacturing process of a top-gate transistor 320. FIG. 5 illustrates an example of a structure of a manufacturing apparatus. Unlike in Embodiment 1, a method for forming the oxide semiconductor film which includes the c-axis-aligned crystalline region through two separate steps will be described in this embodiment.

Figure 4E:
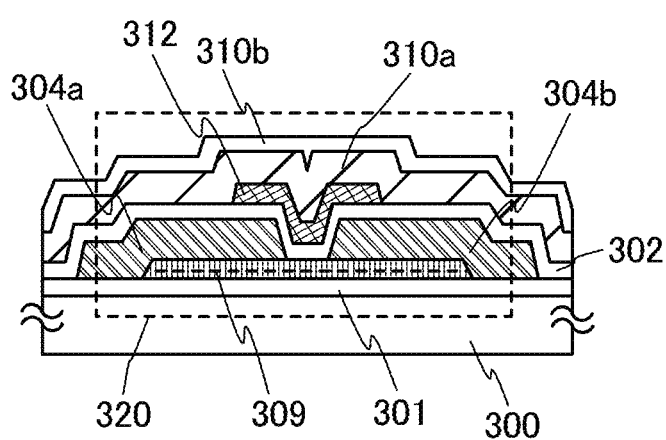
Figure 5:
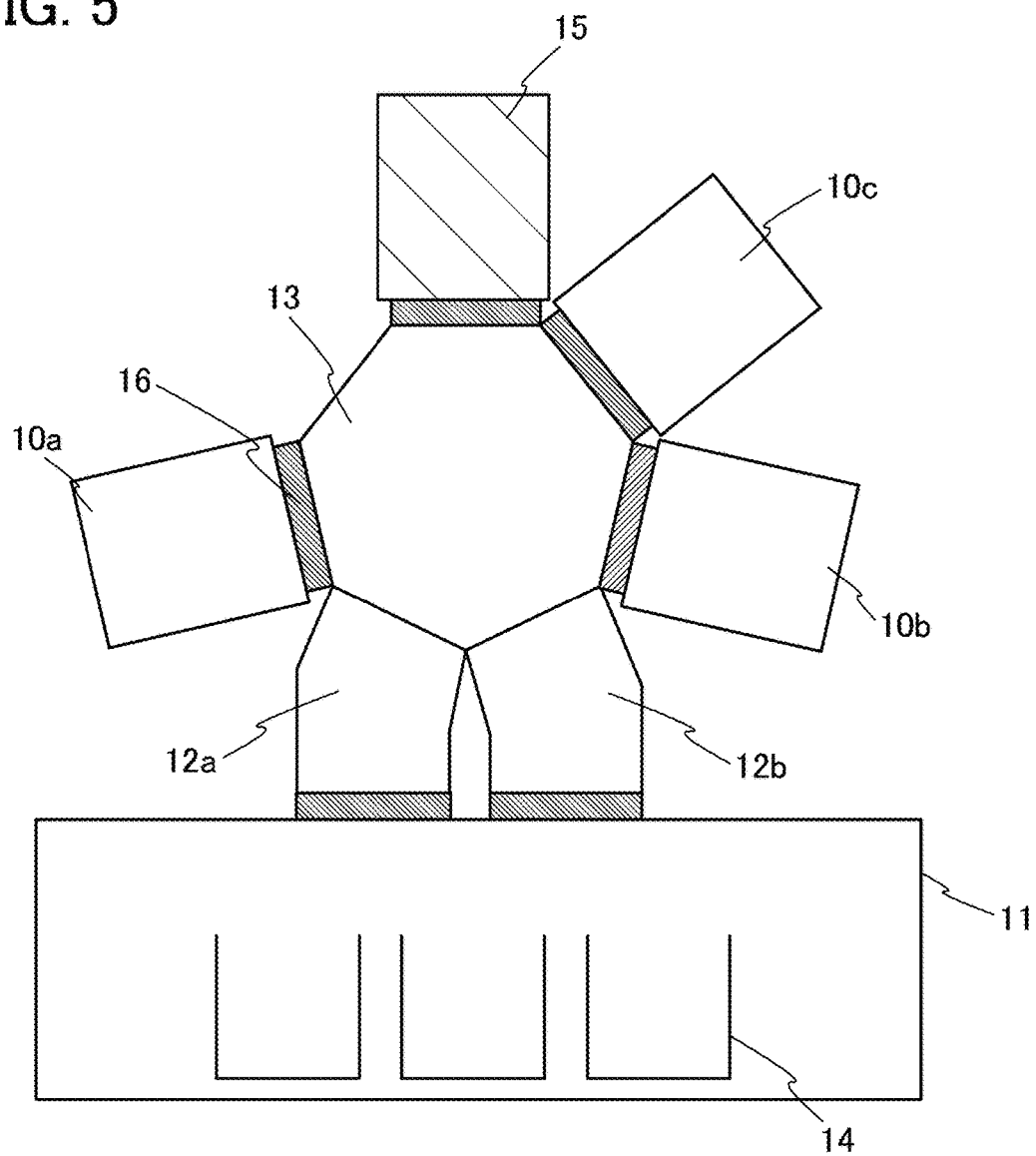
FIG. 5 is a schematic view illustrating a manufacturing apparatus.

FIG. 4E is a cross-sectional view of the top-gate transistor 320. The transistor 320 includes, over a substrate 300 having an insulating surface, an insulating film 301, an oxide semiconductor film 309 including a channel formation region, a source electrode 304a, a drain electrode 304b, a gate insulating film 302, a gate electrode 312, and an insulating film 310a. The source electrode 304a and the drain electrode 304b are provided so as to cover end portions of the oxide semiconductor film 309. The gate insulating film 302 covering the source electrode 304a and the drain electrode 304b is in contact with part of the oxide semiconductor film 309. The gate electrode 312 is provided over part of the oxide semiconductor film 309 with the gate insulating film 302 interposed therebetween.

Further, the insulating film 310a and an insulating film 310b are provided over the gate insulating film 302 and the gate electrode 312.

A process for manufacturing the transistor 320 over the substrate will be described below with reference to FIGS. 4A to 4E.

First, the insulating film 301 is formed over the substrate 300 (see FIG. 4A).

As the substrate 100, a non-alkali glass substrate formed by a fusion method or a float method, for example, plastic substrates having heat resistance sufficient to withstand a process temperature of this manufacturing process can be used. In addition, a substrate where an insulating film is provided on a surface of a metal substrate such as a stainless steel substrate, or a substrate where an insulating film is provided on a surface of a semiconductor substrate may be used. In the case where the substrate 300 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like. High process temperature and a long period of process time drastically shrink the mother glass. Thus, in the case where mass production is performed with use of the mother glass, the preferable heating temperature in the manufacturing process is lower than or equal to 600° C., further preferably, lower than or equal to 450° C.

The insulating film 301 is formed by a PCVD method or a sputtering method to a thickness greater than or equal to 50 nm and less than or equal to 600 nm, using one of a silicon oxide film, a gallium oxide film, an aluminum oxide film, a silicon nitride film, a silicon oxynitride film, an aluminum oxynitride film, and a silicon nitride oxide film or a stacked layer including any of the above films. The insulating film 301 used as a base insulating film preferably contains oxygen at an amount which exceeds at least that in the stoichiometric composition ratio in the film (the bulk). For example, in the case where a silicon oxide film is used, the composition formula is $SiO_{2+\alpha}$ ($\alpha>0$). When the amount of oxygen contained in the insulating film 301 is increased, the oxygen can be supplied from the insulating film 301 to the oxide semiconductor film which is to be formed later.

Further, planarity of a surface of the insulating film 301 is preferably improved. For example, the average surface roughness (Ra) of the insulating film 301 is preferably greater than or equal to 0.1 nm and less than 0.5 nm. When the planarity of the surface of the insulating film 301 is improved, the crystallinity of the oxide semiconductor film which is to be formed later is improved.

In the case where a glass substrate including an impurity such as alkali metal is used, a silicon nitride film, an aluminum nitride film, or the like may be formed as a nitride insulating film between the insulating film 301 and the substrate 300, by a PCVD method or a sputtering method in order to prevent entry of alkali metal. Since an alkali metal such as Li or Na is an impurity, it is preferable to reduce the content of such an alkali metal.

Next, a first oxide semiconductor film is formed to a thickness greater than or equal to 1 nm and less than or equal to 10 nm over the insulating film 301.

In this embodiment, the first oxide semiconductor film is formed to a thickness of 5 nm in an oxygen atmosphere, an argon atmosphere, or an atmosphere including argon and oxygen under conditions where a metal oxide target (an In—Ga—Zn—O-based metal oxide target in which the composition ratio of In to Ga and Zn is 1:1:1 [atomic ratio]) is used, the distance between the substrate and the target is 170 mm, the substrate temperature is 400° C., the pressure is 0.4 Pa, and the direct current (DC) power is 500 W.

The first oxide semiconductor film can be formed by a sputtering method using an argon gas, an oxygen gas, a mixed gas of an argon gas and an oxygen gas, or the like. The substrate is heated during the film formation, whereby the first oxide semiconductor film in which the proportion of a crystalline region is higher than that of an amorphous region can be formed. For example, the substrate temperature may be higher than or equal to 150° C. and lower than or equal to 450° C. The substrate temperature is preferably higher than or equal to 200° C. and lower than or equal to 400° C.

Further, the atmosphere in which the first oxide semiconductor film is formed can be an argon gas atmosphere, an oxygen gas atmosphere, or a mixed gas atmosphere of an argon gas and an oxygen gas, which is preferably a high-purity gas atmosphere. It is preferable to use a high-purity gas atmosphere, for example, from which an impurity such as hydrogen, water, a hydroxyl group, or hydride is removed to a concentration of lower than or equal to 1 ppm (preferably, lower than or equal to 10 ppb).

Further, a flow rate of oxygen in a sputtering atmosphere during the film formation is preferably increased. When the flow rate of oxygen during the film formation is increased, the oxygen concentration in the first oxide semiconductor film can be increased. For example, the flow rate of oxygen to the total gas flow rate is preferably greater than or equal to 10%, more preferably greater than or equal to 30%, even more preferably greater than or equal to 50%.

Crystallization of the first oxide semiconductor film can be further promoted by increasing the substrate temperature.

Next, a first heat treatment is performed under a condition where the atmosphere of a chamber in which the substrate is set is an atmosphere of nitrogen or dry air. The temperature of the first heat treatment is higher than or equal to 400° C. and lower than or equal to 750° C. In addition, heating time of the first heat treatment is longer than or equal to 1 minute and shorter than or equal to 24 hours. By the first heat treatment, a first oxide semiconductor film 308a is formed (see FIG. 4A).

Next, a second oxide semiconductor film is formed to a thickness greater than 10 nm over the first oxide semiconductor film 308a.

In this embodiment, the second oxide semiconductor film is formed to a thickness of 25 nm in an oxygen atmosphere, an argon atmosphere, or an atmosphere including argon and oxygen under conditions where a metal oxide target (an In—Ga—Zn—O-based metal oxide target in which the composition ratio of In to Ga and Zn is 1:1:1 [atomic ratio]) is used, the distance between the substrate and the target is 170 mm, the substrate temperature is 400° C., the pressure is 0.4 Pa, and the direct current (DC) power is 500 W.

Next, a second heat treatment is performed under a condition where the atmosphere of a chamber in which the substrate is set is an atmosphere of nitrogen or dry air. The temperature of the second heat treatment is higher than or equal to 400° C. and lower than or equal to 750° C. In addition, heating time of the second heat treatment is longer than or equal to 1 minute and shorter than or equal to 24 hours. By the second heat treatment, a second oxide semiconductor film 308b is formed (see FIG. 4B).

Through the above steps, an oxide semiconductor film 308 including the first oxide semiconductor film 308a and the second oxide semiconductor film 308b is formed.

When the first heat treatment and the second heat treatment are performed at a temperature higher than 750° C., a crack (a crack extended in the thickness direction) is easily generated in the oxide semiconductor film due to shrink of the glass substrate. Thus, the temperatures of heat treatments performed after formation of the first oxide semiconductor film, e.g., the temperatures of the first heat treatment and the second heat treatment, the substrate temperature in film formation by sputtering, and the like are preferably set to be lower than or equal to 750° C., more preferably lower than or equal to 450° C., whereby a highly reliable transistor can be manufactured over a large-area glass substrate.

It is preferable that the steps from the formation of the insulating film 301 to the second heat treatment be performed successively without exposure to the air. FIG. 5 is a top view illustrating a manufacturing apparatus which can perform the steps from the formation of the insulating film 301 to the second heat treatment successively without exposure to the air.

The manufacturing apparatus illustrated in FIG. 5 is a single wafer multi-chamber apparatus, which includes a sputtering chamber 10a, a sputtering chamber 10b, a sputtering chamber 10c, a substrate supply chamber 11 provided with three cassette ports 14 for holding a process substrate, a load lock chamber 12a, an unload lock chamber 12b, a transfer chamber 13, a substrate heating chamber 15, and the like. Note that a transfer robot for transferring a process substrate is provided in each of the substrate supply chamber 11 and the transfer chamber 13. Further, a gate valve 16 is provided as a partition between the chambers (the sputtering chamber 10a, the load lock chamber 12a, and the like). The atmospheres of the sputtering chambers 10a, 10b, and 10c, the transfer chamber 13, and the substrate heating chamber 15 are preferably controlled so as to hardly contain hydrogen and moisture (i.e., as an inert atmosphere, a reduced pressure atmosphere, or a dry air atmosphere). For example, a preferable atmosphere is a dry nitrogen atmosphere in which the dew point of moisture is lower than or equal to −40° C., preferably lower than or equal to −50° C.

The sputtering chambers 10a, 10b, and 10c are exposed to the air in some cases when a target, an attachment protection plate, or the like is exchanged. After the sputtering chambers are exposed to the air, it is preferable that the atmospheres of the chambers hardly contain hydrogen and moisture. For example, after the chambers are exposed to the air, the chambers are baked to remove hydrogen and moisture which are attached to the inside of the chambers, or pre-sputtering is performed to remove hydrogen and moisture which are attached to a surface of the target or the attachment protection plate, whereby entry of impurities into the oxide semiconductor film can be prevented thoroughly.

The sputtering chambers 10a, 10b, and 10c may each have a structure in which counter flow of a gas from an exhaust pathway is prevented using a cryopump, a turbo molecular pump provided with a cold trap, or the like. It is necessary to prevent entry of a gas from the exhaust pathway thoroughly because it increases the impurity concentration in the oxide semiconductor film.

An example of a procedure of the manufacturing steps with use of the manufacturing apparatus illustrated in FIG. 5 is as follows. A process substrate is transferred from the cassette port 14 to the substrate heating chamber 15 through the load lock chamber 12a and the transfer chamber 13; moisture attached to the process substrate is removed by vacuum baking or the like in the substrate heating chamber 15; the process substrate is transferred to the sputtering chamber 10c through the transfer chamber 13; and the insulating film 301 is formed in the sputtering chamber 10c. Then, the process substrate is transferred to the sputtering chamber 10a through the transfer chamber 13 without exposure to the air, and the first oxide semiconductor film is formed to a thickness of 5 nm in the sputtering chamber 10a. After that, the process substrate is transferred to the substrate heating chamber 15 through the transfer chamber 13 without exposure to the air, and the first heat treatment is performed, so that the first oxide semiconductor film 308a is formed. Then, the process substrate is transferred to the sputtering chamber 10b through the transfer chamber 13 without exposure to the air, and the second oxide semiconductor film is formed to a thickness greater than 10 nm in the sputtering chamber 10b. After that, the process substrate is transferred to the substrate heating chamber 15 through the transfer chamber 13 without exposure to the air, and the second heat treatment is performed, so that the second oxide semiconductor film 308b is formed. After that, the process substrate is transferred to the cassette port 14 through the transfer chamber 13, the unload lock chamber 12b, and the substrate supply chamber 11.

As described above, with use of the manufacturing apparatus illustrated in FIG. 5, the steps from the formation of the insulating film 301 to the second heat treatment can be performed without exposure to the air.

Further, with use of the manufacturing apparatus illustrated in FIG. 5, a process which is different from the process described above and performed without exposure to the air can be achieved by change of the sputtering target in the sputtering chamber. For example, the substrate over which the insulating film 301 is formed in advance is placed in the cassette port 14, and the steps from the formation of the first oxide semiconductor film to the second heat treatment are performed without exposure to the air, so that the oxide semiconductor film 308 is formed. After that, a conductive film for forming the source electrode and the drain electrode can also be formed over the oxide semiconductor film 308 using a metal target in the sputtering chamber 10c without exposure to the air.

As described above, with use of the single wafer multi-chamber apparatus illustrated in FIG. 5, the insulating film 301, the first oxide semiconductor film 308a, and the second oxide semiconductor film 308b can be formed successively.

Note that in FIGS. 4B to 4E, the interface between the first oxide semiconductor film 308a and the second oxide semiconductor film 308b is denoted by a dotted line for description of the oxide semiconductor film 308; however, the interface is actually not distinct and is illustrated for easy understanding.

Further, the oxide semiconductor film 308 is a highly purified oxide semiconductor film from which water, hydrogen, a hydroxyl group, hydride, or the like is removed thoroughly by the film formation process, the heat treatment, or the like. The concentration of hydrogen in the oxide semiconductor film 308 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$.

Further, the total impurity concentration of phosphorus (P), boron (B), and nitrogen (N) which are n-type impurities and contained in the oxide semiconductor film 308, is preferably lower than or equal to $5\times10^{19}$ atoms/cm$^3$, more preferably lower than or equal to $5\times10^{18}$ atoms/cm$^3$. Further, the concentration of any one of phosphorus (P), boron (B), and nitrogen (N) which are n-type impurities is preferably lower than or equal to $1.0\times10^{19}$ atoms/cm$^3$, more preferably lower than or equal to $1.0\times10^{18}$ atoms/cm$^3$.

In this manner, impurities that might impart n-type conductivity are removed thoroughly from the oxide semiconductor film 308, whereby the oxide semiconductor film 308 can be made i-type (intrinsic).

Next, the oxide semiconductor film 308 is processed into the island-shaped oxide semiconductor film 309 (see FIG. 4C). The oxide semiconductor film 308 can be processed by being etched after a mask having a desired shape is formed over the oxide semiconductor film 308. The mask may be formed by a method such as photolithography or an ink-jet method.

For the etching of the oxide semiconductor film 308, either wet etching or dry etching may be employed. It is needless to say that both of them may be employed in combination.

Next, a conductive film for forming the source electrode and the drain electrode (including a wiring formed in the same layer as the source electrode and the drain electrode) is formed over the island-shaped oxide semiconductor film 309 and processed to form the source electrode 304a and the drain electrode 304b (see FIG. 4C). The source electrode 304a and the drain electrode layer 304b can be formed by a sputtering method or the like to have a single-layer structure or a stacked-layer structure using any of metal materials such as molybdenum, titanium, tantalum, tungsten, aluminum, copper, neodymium, and scandium or an alloy material containing any of the above metal materials.

Next, the gate insulating film 302 being in contact with part of the oxide semiconductor film 309 and covering the source electrode 304a and the drain electrode 304b is formed (see FIG. 4D). The gate insulating film 302 is an oxide insulating film, which is formed by a plasma CVD method, a sputtering method, or the like to have a single-layer structure or a stacked-layer structure using silicon oxide, silicon oxynitride, silicon nitride oxide, aluminum oxide, gallium oxide, aluminum oxynitride, aluminum nitride oxide, hafnium oxide, or a combination thereof. The thickness of the gate insulating film 302 is from 10 nm to 200 nm.

In this embodiment, as the gate insulating film 302, a silicon oxide film is formed by a sputtering method to a thickness of 100 nm. After formation of the gate insulating film 302, a third heat treatment is performed. By the third heat treatment, oxygen is supplied from the gate insulating film 302 to the oxide semiconductor film 309. The third heat treatment is performed at a temperature higher than or equal to 200° C. and lower than or equal to 400° C., preferably higher than or equal to 250° C. and lower than or equal to 320° C., in an inert atmosphere, an oxygen atmosphere, or a mixed atmosphere of oxygen and nitrogen. In addition, heating time of the third heat treatment is longer than or equal to 1 minute and shorter than or equal to 24 hours. Note that when the heat temperature of the third heat treatment is higher than 320° C., the on-state characteristics of a transistor may be degraded.

Next, after a conductive film is formed over the gate insulating film 302, the gate electrode 312 is formed through a photolithography step and an etching step (see FIG. 4E). The gate electrode 312 overlaps with part of the oxide semiconductor film 309 with the gate insulating film 302 interposed therebetween. The gate electrode 312 can be formed by a sputtering method or the like to have a single-layer structure or a stacked-layer structure using a metal material such as molybdenum, titanium, tantalum, tungsten, aluminum, copper, neodymium, or scandium, or an alloy material containing any of these materials.

Next, the insulating film 310a and the insulating film 310b are formed to cover the gate electrode 312 and the gate insulating film 302 (see FIG. 4E).

The insulating film 310a and the insulating film 310b can be formed to have a single-layer structure or a stacked-layer structure using silicon oxide, silicon nitride, gallium oxide, silicon oxynitride, silicon nitride oxide, aluminum oxide, aluminum nitride, aluminum oxynitride, aluminum nitride oxide, or a combination thereof. In this embodiment, as the insulating film 310a, a silicon oxide film having a thickness of 300 nm is formed by a sputtering method, and a heat treatment is performed for an hour at 250° C. in a nitrogen atmosphere. Then, in order to prevent entry of moisture or alkali metal, as the insulating film 310b, a silicon nitride film is formed by a sputtering method. Since an alkali metal such as Li or Na is an impurity, the content of such an alkali metal is preferably reduced. The concentration of such an alkali metal in the oxide semiconductor film 309 is lower than or equal to $5\times10^{16}$ atoms/cm$^3$, preferably, lower than or equal to $1\times10^{16}$ atoms/cm$^3$. Although a two-layer structure of the insulating film 310a and the insulating film 310b is exemplified in this embodiment, a single-layer structure may be used.

Through the above process, the top-gate transistor 320 is formed.

In the transistor 320 illustrated in FIG. 4E, at least part of the first oxide semiconductor film 308a or the second oxide semiconductor film 308b includes a c-axis-aligned crystalline region. When the first oxide semiconductor film 308a or the second oxide semiconductor film 308b includes the c-axis-aligned crystalline region, the first oxide semiconductor film 308a or the second oxide semiconductor film 308b has favorable crystallinity unlike an oxide semiconductor film which is entirely amorphous; therefore, oxygen vacancies, dangling bonds, or impurities such as hydrogen, boron, nitrogen, and phosphorus bonded to dangling bonds or the like are reduced.

Accordingly, the oxide semiconductor film which contains indium (In), gallium (Ga), and zinc (Zn) and includes the c-axis-aligned crystalline region can be electrically stable.

The structures and the like described in this embodiment can be combined as appropriate with any of the structures, methods, and the like described in other embodiments.

Embodiment 3

In this embodiment, transistors whose structures are different from a structure of the top-gate transistor 320 described in Embodiment 2 will be described with reference to FIGS. 6A to 6C. Components that are similar to the components of the transistor 320 described in Embodiment 2 are denoted by the same reference numerals, and description of such components is not repeated.

Figure 6A:
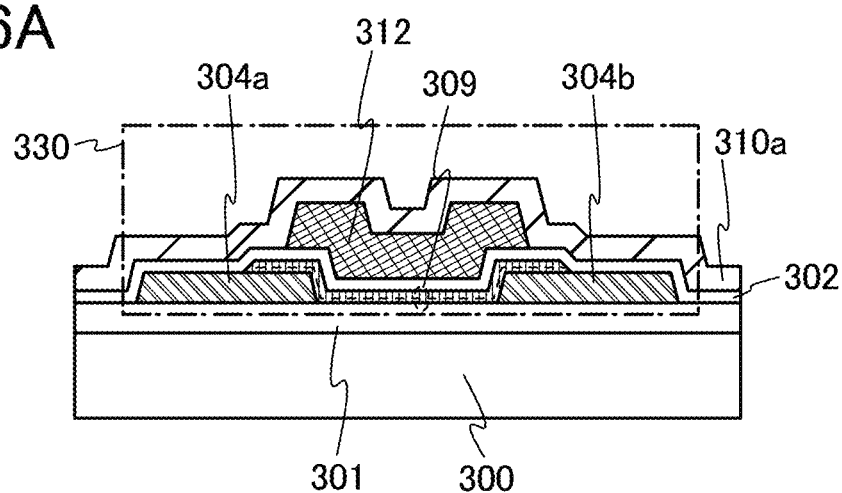
FIGS. 6A to 6C are cross-sectional views each illustrating a semiconductor device according to one embodiment of the present invention.
Figure 6B:
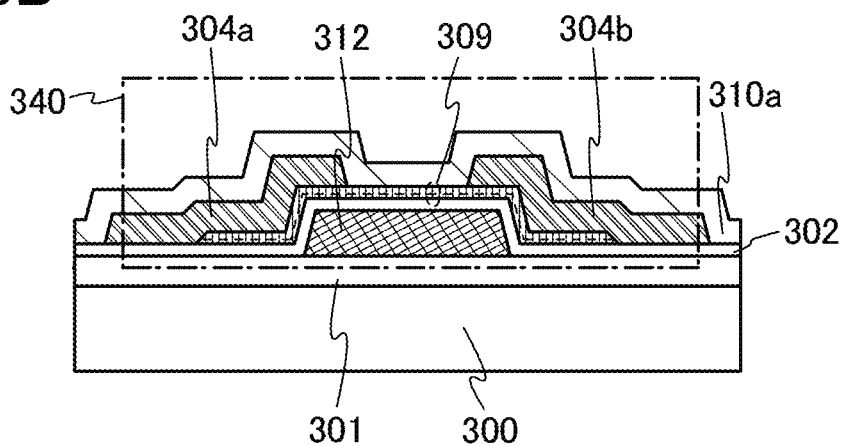
Figure 6C:
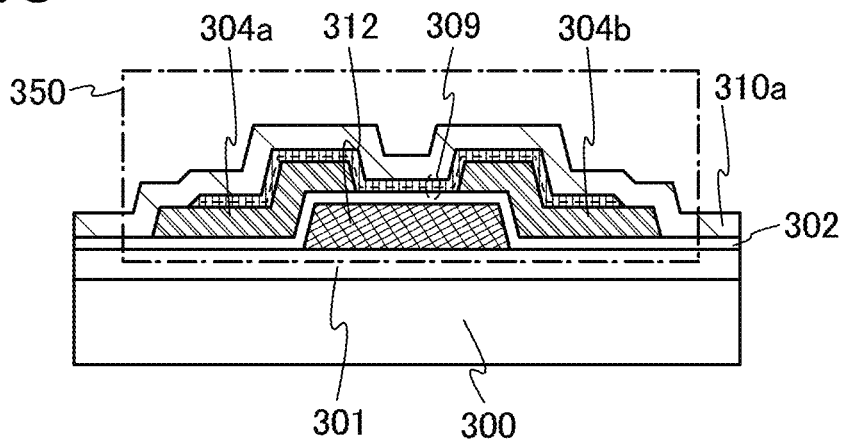

In the transistor illustrated in FIGS. 6A to 6C, the oxide semiconductor film which contains indium, gallium, and zinc and includes the c-axis-aligned crystalline region, described in Embodiment 1, is used for a channel formation region, whereby the transistor can have high reliability.

A transistor 330 illustrated in FIG. 6A includes the insulating film 301 provided over the substrate 300; the source electrode 304a and the drain electrode 304b provided over the insulating film 301; the oxide semiconductor film 309 provided in contact with upper surfaces and side surfaces of the source electrode 304a and the drain electrode 304b; the gate insulating film 302 provided over the oxide semiconductor film 309; the gate electrode 312 provided over the gate insulating film 302 so as to overlap with the oxide semiconductor film 309; and the insulating film 310a provided over the gate electrode 312. In other words, the transistor 330 is different from the transistor 320 in that the oxide semiconductor film 309 is provided in contact with the upper surfaces and the side surfaces of the source electrode 304a and the drain electrode 304b.

A transistor 340 illustrated in FIG. 6B includes the insulating film 301 provided over the substrate 300; the gate electrode 312 provided over the insulating film 301; the gate insulating film 302 provided over the gate electrode 312; the oxide semiconductor film 309 provided over the gate insulating film 302; the source electrode 304a and the drain electrode 304b provided in contact with an upper surface and side surfaces of the oxide semiconductor film 309; and the insulating film 310a provided over the oxide semiconductor film 309. In other words, the transistor 340 is different from the transistor 320 in that it has a bottom gate structure in which the gate electrode 312 and the gate insulating film 302 are provided below the oxide semiconductor film 309.

A transistor 350 illustrated in FIG. 6C includes the insulating film 301 provided over the substrate 300; the gate electrode 312 provided over the insulating film 301; the gate insulating film 302 provided over the gate electrode 312; the source electrode 304a and the drain electrode 304b provided over the gate insulating film 302; the oxide semiconductor film 309 provided in contact with upper surfaces and side surfaces of the source electrode 304a and the drain electrode 304b; and the insulating film 310a provided over the oxide semiconductor film 309. In other words, the transistor 350 is different from the transistor 330 in that it has a bottom gate structure in which the gate electrode 312 and the gate insulating film 302 are provided below the oxide semiconductor film 309.

Note that in each of the transistor 330, the transistor 340, and the transistor 350, which are illustrated in FIGS. 6A to 6C, at least part of the oxide semiconductor film 309 includes the c-axis-aligned crystalline region. When the oxide semiconductor film 309 includes the c-axis-aligned crystalline region, the oxide semiconductor film 309 has favorable crystallinity unlike an oxide semiconductor film which is entirely amorphous; therefore, oxygen vacancies, dangling bonds, or impurities such as hydrogen, boron, nitrogen, and phosphorus bonded to dangling bonds or the like are reduced.

Accordingly, the oxide semiconductor film which contains indium (In), gallium (Ga), and zinc (Zn) and includes the c-axis-aligned crystalline region can be electrically stable.

In this manner, the oxide semiconductor film according to one embodiment of the present invention can be applied to transistors with various structures.

The structures, methods, and the like described in this embodiment can be combined as appropriate with any of the structures, methods, and the like described in other embodiments.

Embodiment 4

In this embodiment, a display device in which at least part of a driver circuit and a transistor to be disposed in a pixel portion are formed over one substrate will be described below with reference to FIGS. 7A to 7C.

As the transistor to be disposed in the pixel portion, the transistor described in Embodiment 2 or 3 is used. Further, the transistor can easily be an n-channel transistor; thus, part of a driver circuit that can be formed using an n-channel thin film transistor (TFT) in the driver circuit is formed over the same substrate as the transistor of the pixel portion. By using the transistor described in Embodiment 2 or 3 for the pixel portion or the driver circuit as described above, a highly reliable display device can be provided.

Figure 7A:
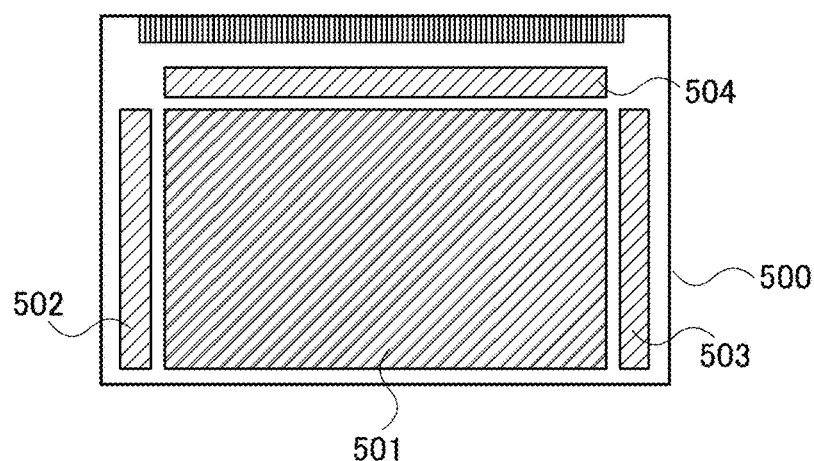
FIGS. 7A to 7C are a block diagram and equivalent circuit diagrams illustrating one embodiment of the present invention.

FIG. 7A is an example of a block diagram of an active matrix display device. A pixel portion 501, a first scan line driver circuit 502, a second scan line driver circuit 503, and a signal line driver circuit 504 are provided over a substrate 500 in the display device. In the pixel portion 501, a plurality of signal lines extended from the signal line driver circuit 504 are arranged and a plurality of scan lines extended from the first scan line driver circuit 502 and the second scan line driver circuit 503 are arranged. Note that pixels which include display elements are provided in a matrix in respective regions where the scan lines and the signal lines intersect with each other. The substrate 500 of the display device is connected to a timing control circuit (also referred to as controller or control IC) through a connection portion such as a flexible printed circuit (FPC).

In FIG. 7A, the first scan line driver circuit 502, the second scan line driver circuit 503, and the signal line driver circuit 504 are formed over the same substrate 500 as the pixel portion 501. Accordingly, the number of components of a driver circuit which is provided outside and the like are reduced, so that reduction in cost can be achieved. Further, when the driver circuit is provided outside the substrate 500, wiring would need to be extended and the number of wiring connections would be increased, but when the driver circuit is provided over the substrate 500, the number of wiring connections can be reduced. Accordingly, the reliability or yield can be improved.

Figure 7B:
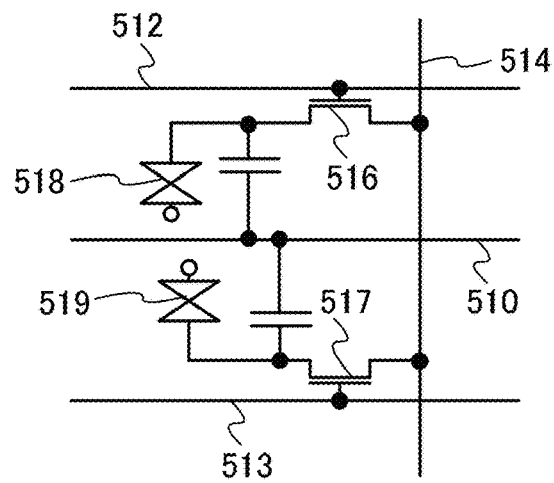

FIG. 7B illustrates an example of a circuit configuration of the pixel portion. Here, a pixel structure of a VA liquid crystal display panel is shown.

In this pixel structure, a plurality of pixel electrode layers are provided in one pixel, and transistors are connected to respective pixel electrode layers. The transistors are driven by different gate signals. In other words, signals applied to individual pixel electrode layers in a multi-domain pixel are controlled independently.

A gate wiring 512 of a transistor 516 and a gate wiring 513 of a transistor 517 are separated so that different gate signals can be given thereto. In contrast, a source or drain electrode layer 514 functioning as a data line is used in common for the transistors 516 and 517. As the transistors 516 and 517, the transistor described in the above embodiment can be used as appropriate. In the above manner, a highly reliable liquid crystal display panel can be provided.

A first pixel electrode layer connected to the transistor 516 and a second pixel electrode layer connected to the transistor 517 have different shapes and are separated by a slit. The second pixel electrode layer is provided so as to surround the external side of the first pixel electrode layer which is spread in a V shape. Timing of voltage application is made to vary between the first and second pixel electrode layers by the transistors 516 and 517 in order to control alignment of the liquid crystal. The transistor 516 is connected to the gate wiring 512, and the transistor 517 is connected to the gate wiring 513. When different gate signals are supplied to the gate wiring 512 and the gate wiring 513, operation timings of the transistor 516 and the transistor 517 can be varied.

Further, a storage capacitor is formed using a capacitor wiring 510, a gate insulating film functioning as a dielectric, and a capacitor electrode connected to the first pixel electrode layer or the second pixel electrode layer.

The first pixel electrode layer, a liquid crystal layer, and a counter electrode layer overlap with one another to form a first liquid crystal element 518. In addition, the second pixel electrode layer, the liquid crystal layer, and the counter electrode layer overlap with one another to form a second liquid crystal element 519. The pixel structure is a multi-domain structure in which the first liquid crystal element 518 and the second liquid crystal element 519 are provided in one pixel.

Note that the pixel structure is not limited to that illustrated in FIG. 7B. For example, a switch, a resistor, a capacitor, a transistor, a sensor, a logic circuit, or the like may be added to the pixel illustrated in FIG. 7B.

Figure 7C:
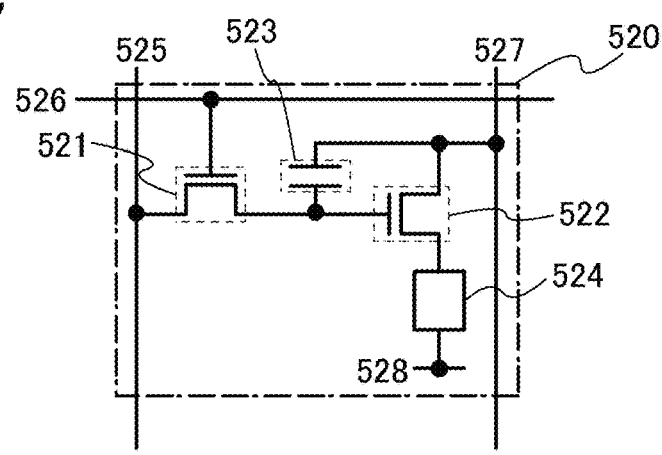

FIG. 7C shows an example of a circuit configuration different from the circuit configuration in the pixel portion illustrated in FIG. 7B. Here, a pixel structure of a display panel using an organic EL element is shown.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as current-excitation light-emitting element.

The following shows the structure and operation of a pixel by which the organic EL element can be driven. Here, one pixel includes two n-channel transistors each of which includes the oxide semiconductor film according to one embodiment of the present invention as a channel formation region.

A pixel 520 includes a switching transistor 521, a driving transistor 522, a light-emitting element 524, and a capacitor 523. A gate electrode layer of the switching transistor 521 is connected to a scan line 526, a first electrode (one of a source electrode layer and a drain electrode layer) of the switching transistor 521 is connected to a signal line 525, and a second electrode (the other of the source electrode layer and the drain electrode layer) of the switching transistor 521 is connected to a gate electrode layer of the driving transistor 522. The gate electrode layer of the driving transistor 522 is connected to a power supply line 527 through the capacitor 523, a first electrode of the driving transistor 522 is connected to the power supply line 527, and a second electrode of the driving transistor 522 is connected to a first electrode (pixel electrode) of the light-emitting element 524. A second electrode of the light-emitting element 524 corresponds to a common electrode 528. The common electrode 528 is connected to a common potential line formed over the same substrate as the common electrode 528.

As the switching transistor 521 and the driving transistor 522, the transistor described in Embodiment 2 or 3 can be used as appropriate. In this manner, a highly reliable display panel including an organic EL element can be provided.

Note that the second electrode (the common electrode 528) of the light-emitting element 524 is set to have a low power supply potential. Note that the low power supply potential is a potential satisfying the low power supply potential< a high power supply potential with reference to the high power supply potential that is set for the power supply line 527. As the low power supply potential, GND, 0 V, or the like may be employed, for example. In order to make the light-emitting element 524 emit light by applying a potential difference between the high power supply potential and the low power supply potential to the light-emitting element 524 so that current is supplied to the light-emitting element 524, each of the potentials is set so that the potential difference between the high power supply potential and the low power supply potential is higher than or equal to the forward threshold voltage of the light-emitting element 524.

Gate capacitance of the driving transistor 522 may be used as a substitute for the capacitor 523, in which case the capacitor 523 can be omitted. The gate capacitance of the driving transistor 522 may be formed between a channel formation region and the gate electrode layer.

In the case of performing analog grayscale driving, a voltage of higher than or equal to the sum of the forward voltage of the light-emitting element 524 and $V_{th}$ of the driving transistor 522 is applied to the gate electrode layer of the driving transistor 522. The forward voltage of the light-emitting element 524 indicates a voltage at which a desired luminance is obtained, and includes at least a forward threshold voltage. A video signal by which the driving transistor 522 is operated in a saturation region is input, so that current can be supplied to the light-emitting element 524. In order for the driving transistor 522 to operate in a saturation region, the potential of the power supply line 527 is set to be higher than the gate potential of the driving transistor 522. Since the video signal is an analog signal, a current in accordance with the video signal can be supplied to the light-emitting element 524, and analog grayscale driving can be performed.

Note that the pixel structure is not limited to that illustrated in FIG. 7C. For example, a switch, a resistor, a capacitor, a sensor, a transistor, a logic circuit, or the like may be added to the pixel illustrated in FIG. 7C.

As described above, the transistor described in Embodiment 2 or 3 is used for the pixel portion or the driver circuit, and at least part of the oxide semiconductor film used for the channel formation region in the transistor includes the c-axis-aligned crystalline region, and thus, the transistor can have high reliability. Accordingly, a highly reliable display device can be provided.

The structures, methods, and the like described in this embodiment can be combined as appropriate with any of the structures, methods, and the like described in other embodiments.

Embodiment 4

A semiconductor device disclosed in this specification can be applied to a variety of electronic appliances (including game machines). Examples of electronic appliances are a television set (also referred to as television or television receiver), a monitor of a computer or the like, a camera such as a digital camera or a digital video camera, a digital photo frame, a mobile phone handset (also referred to as mobile phone or mobile phone device), a portable game machine, a portable information terminal, an audio reproducing device, a large-sized game machine such as a pachinko machine, and the like. Examples of electronic appliances each including the display device described in Embodiment 4 are described.

Figure 8A:
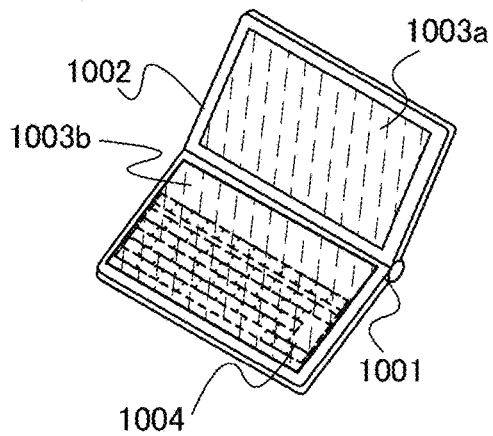
FIGS. 8A to 8D are external views each illustrating an electronic appliance according to one embodiment of the present invention.

FIG. 8A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated and text can be input. Needless to say, the display portion 1003a may be a touch panel. A liquid crystal panel or an organic light-emitting panel is manufactured by using the transistor described in Embodiment 2 or 3 as a switching element and applied to the display portion 1003a or 1003b, whereby a highly reliable portable information terminal can be provided.

The portable information terminal illustrated in FIG. 8A can have a function of displaying a variety of kinds of information (e.g., a still image, a moving image, and a text image), a function of displaying a calendar, a date, the time, or the like on the display portion, a function of operating or editing the information displayed on the display portion, a function of controlling processing by a variety of kinds of software (programs), and the like. Furthermore, an external connection terminal (e.g., an earphone terminal or a USB terminal), a recording medium insertion portion, and the like may be provided on the back surface or the side surface of the housing.

The portable information terminal illustrated in FIG. 8A may transmit and receive data wirelessly. Through wireless communication, desired book data or the like can be purchased and downloaded from an electronic book server.

Figure 8B:
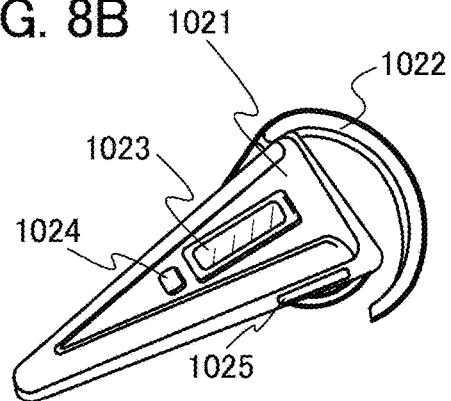

FIG. 8B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is manufactured by using the transistor described in Embodiment 2 or 3 as a switching element and applied to the display portion 1023, whereby a highly reliable portable music player can be provided.

Furthermore, when the portable music player illustrated in FIG. 8B has an antenna, a microphone function, or a wireless communication function and is used with a mobile phone, a user can talk on the phone wirelessly in a hands-free way while driving a car or the like.

Figure 8C:
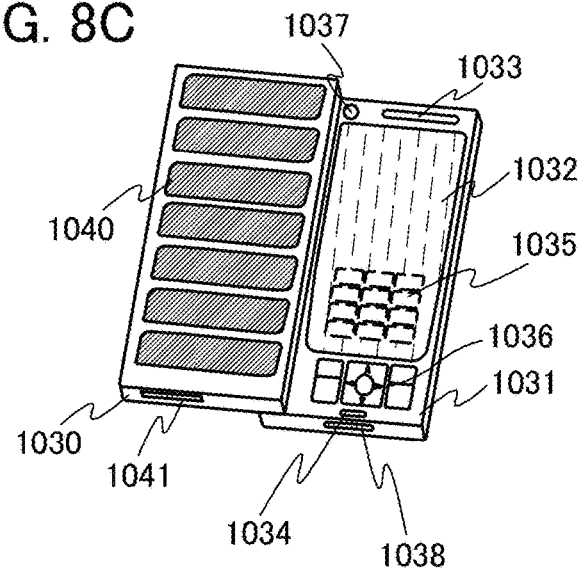

FIG. 8C illustrates a mobile phone including two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. The transistor described in Embodiment 2 or 3 is applied to the display panel 1032, whereby a highly reliable mobile phone can be provided.

Further, the display panel 1032 includes a touch panel. A plurality of operation keys 1035 which are displayed as images are indicated by dotted lines in FIG. 8C. Note that a boosting circuit by which a voltage output from the solar cell 1040 is increased to be sufficiently high for each circuit is also included.

For example, a power transistor used for a power supply circuit such as a boosting circuit can also be formed when the oxide semiconductor film of the transistor described in Embodiment 2 or 3 has a thickness of greater than or equal to 2 μm and less than or equal to 50 μm.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, and the like as well as voice calls. Moreover, the housings 1030 and 1031 in a state where they are developed as illustrated in FIG. 8C can be slid so that one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 8D:
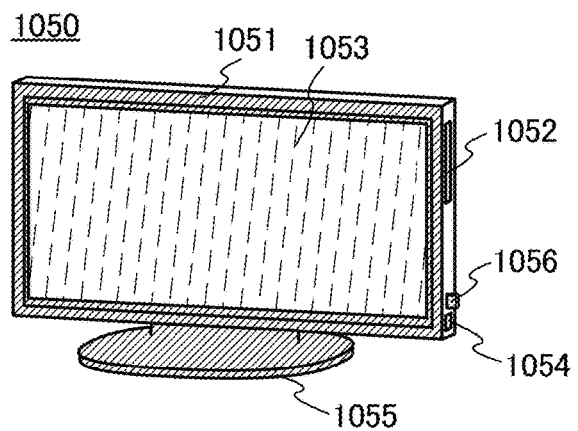

FIG. 8D illustrates an example of a television set. In a television set 1050, a display portion 1053 is incorporated in a housing 1051. Images can be displayed on the display portion 1053. Here, the housing 1051 is supported on a stand 1055 incorporating a CPU. The transistor described in Embodiment 2 or 3 is applied to the display portion 1053, whereby the highly reliable television set 1050 can be provided.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the receiver, general television broadcasting can be received. Moreover, when the display device is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, data stored in the storage medium can be read, and data can be written to the storage medium. In addition, an image, a video, or the like stored as data in an external memory 1056 inserted into the external memory slot can be displayed on the display portion 1053.

The structures, methods, and the like described in this embodiment can be combined as appropriate with any of the structures, methods, and the like described in other embodiments.

Example 1

In this example, an oxide semiconductor film (an amo-OS film, Sample 1) which is entirely amorphous and contains indium, gallium, and zinc, oxide semiconductor films (CAAC-OS films, Sample 2 and Sample 3) according to one embodiment of the disclosed invention, each of which contains indium, gallium, and zinc and includes a c-axis-aligned crystalline region were formed by changing film formation conditions, and oxygen vacancies in each of the oxide semiconductor films of Samples 1 to 3 were measured. The details of each sample are as follows.

(Sample 1)

An IGZO film was formed over a quartz substrate to a thickness of 100 nm by a sputtering method. After that, the IGZO film was subjected to a heat treatment at 450° C. for one hour in an $N_2$ atmosphere (the proportion of $N_2$ was 100%). After that, a SiON film was formed over the IGZO film to a thickness of 400 nm by a plasma CVD method. Note that the IGZO film was formed under conditions where a metal oxide target with In:Ga:Zn=1:1:1 was used; the Ar gas flow rate was 90 sccm and the $O_2$ gas flow rate was 10 sccm (the proportion of the $O_2$ gas flow rate was 10%); the film formation pressure was 0.6 Pa; the film formation power was 5 kw (DC); and the substrate temperature was 170° C. Further, the SiON film was formed under conditions where the $SiH_4$ gas flow rate was 30 sccm and the $N_2O$ gas flow rate was 4000 sccm; the film formation pressure was 200 Pa; the film formation power was 150 W (RF); and the substrate temperature was 220° C.

(Sample 2)

An IGZO film was formed over a quartz substrate to a thickness of 100 nm by a sputtering method. After that, the IGZO film was subjected to a heat treatment at 450° C. for one hour in an $N_2$ atmosphere (the proportion of $N_2$ was 100%). After that, a SiON film was formed over the IGZO film to a thickness of 400 nm by a plasma CVD method. Note that the IGZO film was formed under conditions where a metal oxide target with In:Ga:Zn=1:1:1 was used; the Ar gas flow rate was 50 sccm and the $O_2$ gas flow rate was 50 sccm (the proportion of the $O_2$ gas flow rate was 50%); the film formation pressure was 0.6 Pa; the film formation power was 5 kw (DC); and the substrate temperature was 170° C. The SiON film was formed under the same conditions as Sample 1.

(Sample 3)

An IGZO film was formed over a quartz substrate to a thickness of 100 nm by a sputtering method. After that, the IGZO film was subjected to a heat treatment at 450° C. for one hour in an $N_2$ atmosphere (the proportion of $N_2$ was 100%). After that, a SiON film was formed over the IGZO film to a thickness of 400 nm by a plasma CVD method. Note that the IGZO film was formed under conditions where a metal oxide target with In:Ga:Zn=1:1:1 was used; the Ar gas flow rate was 0 sccm and the $O_2$ gas flow rate was 100 sccm (the proportion of the $O_2$ gas flow rate was 100%); the film formation pressure was 0.6 Pa; the film formation power was 2 kw (DC); and the substrate temperature was 170° C. The SiON film was formed under the same conditions as Sample 1 and Sample 2.

Oxygen vacancies in each of the oxide semiconductor films of Samples 1 to 3 were measured at the following timings: after the SiON film was formed; after a heat treatment was performed at 300° C. for one hour in an $N_2$ atmosphere (the proportion of $N_2$ was 100%); and after a heat treatment was performed at 300° C. for one hour in an atmosphere containing $N_2$ and $O_2$ (the proportion of $N_2$ was 80% and the proportion of $O_2$ was 20%).

The oxygen vacancies in each of the oxide semiconductor films of Samples 1 to 3 can be measured by electron spin resonance (ESR).

FIGS. 9A to 9C and FIG. 10 show measurement results of the spin density in Samples 1 to 3. Measurement conditions of the spin density were as follows. The temperature was 25° C., the power of microwaves (9.2 GHz) was 20 mW, the direction of a magnetic field was parallel to a surface of each of the oxide semiconductor films, and the lower limit of the detection was $1.0 \times 10^{17}$ spins/cm$^3$.

Figure 9A:
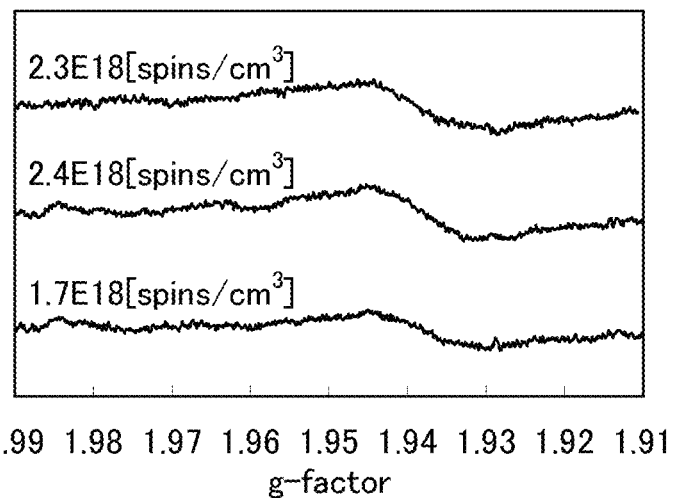
FIGS. 9A to 9C are graphs showing measurement results of the spin density in Example.
Figure 9B:
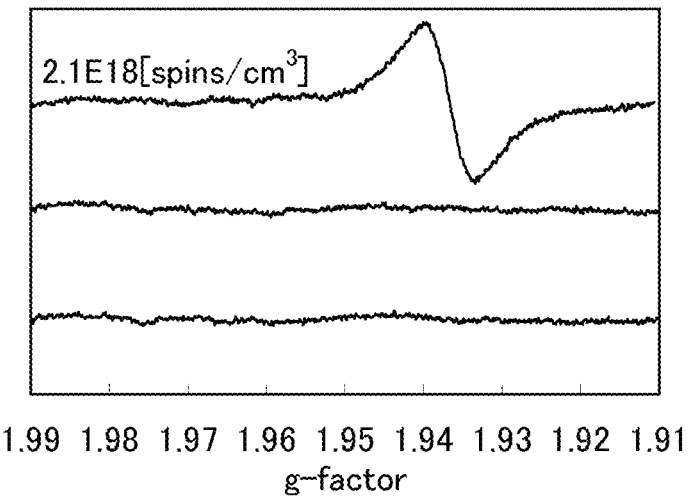
Figure 9C:
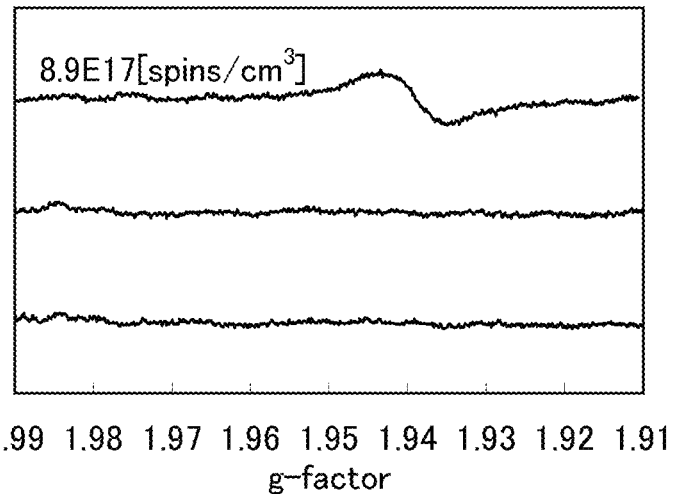

FIG. 9A shows measurement results of the spin density in Sample 1, FIG. 9B shows measurement results of the spin density in Sample 2, and FIG. 9C shows measurement results of the spin density in Sample 3. In each of FIGS. 9A to 9C, a spectrum in a top row shows a measurement result of the spin density after the SiON film was formed, a spectrum in a middle row shows a measurement result of the spin density after the heat treatment was performed at 300° C. for one hour in an $N_2$ atmosphere (the proportion of $N_2$ was 100%), and a spectrum in a bottom row shows a measurement result of the spin density after the heat treatment was performed at 300° C. for one hour in an atmosphere containing $N_2$ and $O_2$ (the proportion of $N_2$ was 80% and the proportion of $O_2$ was 20%). Note that in each of FIGS. 9A to 9C, the horizontal axis indicates a g-factor (also referred to as g value), and the vertical axis indicates the intensity.

Figure 10:
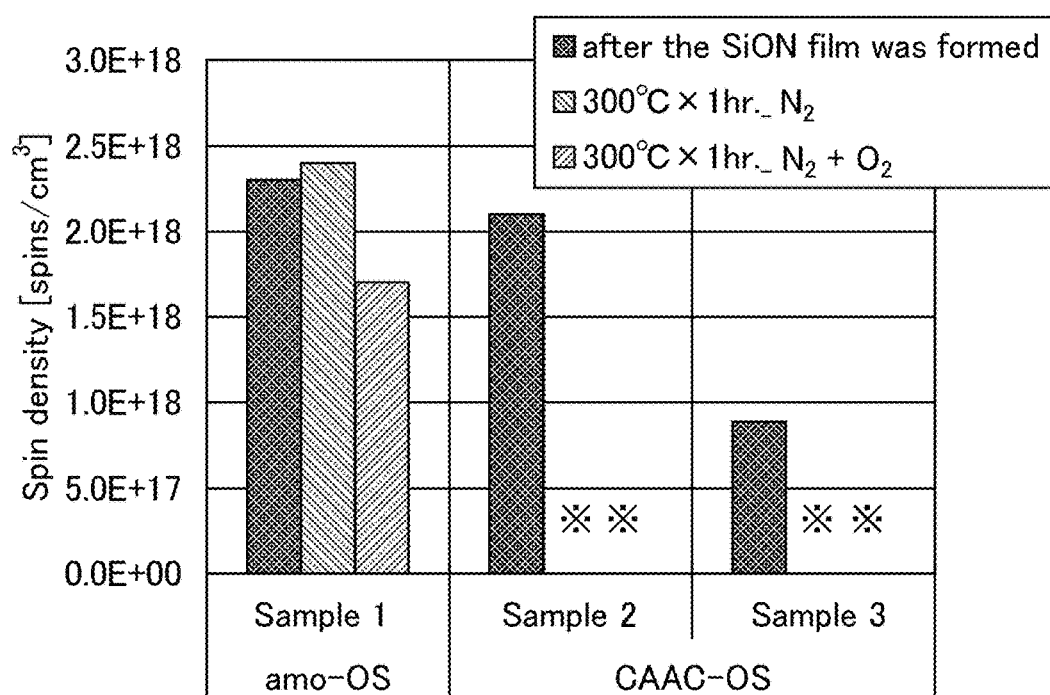
FIG. 10 is a graph showing measurement results of the spin density in Example.

FIG. 10 is a bar graph showing the results of the spin density shown in FIGS. 9A to 9C.

As shown in FIGS. 9A to 9C and FIG. 10, after the SiON film was formed, the spin density of Sample 1 was $2.3 \times 10^{18}$ spins/cm$^3$, the spin density of Sample 2 was $2.1 \times 10^{18}$ spins/cm$^3$, and the spin density of Sample 3 was $8.9 \times 10^{17}$ spins/cm$^3$. Further, after the heat treatment was performed at 300° C. for one hour in an $N_2$ atmosphere, the spin density of Sample 1 was $2.4 \times 10^{18}$ spins/cm$^3$, and the spin density of Sample 2 and Sample 3 was lower than the lower limit of the detection. Further, after the heat treatment was performed at 300° C. for one hour in an atmosphere containing $N_2$ and $O_2$, the spin density of Sample 1 was $1.7 \times 10^{18}$ spins/cm$^3$, and the spin density of Sample 2 and Sample 3 was lower than the lower limit of the detection.

The graphs show that the number of oxygen vacancies in the oxide semiconductor film (an amo-OS film, Sample 1) which is entirely amorphous is different from the numbers of oxygen vacancies in the oxide semiconductor films (CAAC-OS films, Sample 2 and Sample 3) according to one embodiment of the disclosed invention, each of which includes a c-axis-aligned crystalline region. In Sample 1, after the heat treatment was performed at 300° C. for one hour in an atmosphere containing $N_2$ and $O_2$, the spin density was decreased. In other words, it can be confirmed that oxygen vacancies in the oxide semiconductor film were partially filled with oxygen in the SiON film or oxygen in an atmosphere of the heat treatment. However, the oxygen vacancies were not completely filled with oxygen. On the other hand, in each of Sample 2 and Sample 3, by heat treatment performed after the SiON film was formed, the spin density was decreased to lower than the lower limit of the detection. In other words, it can be confirmed that oxygen vacancies in the oxide semiconductor film were filled with oxygen in the SiON film or oxygen in an atmosphere of the heat treatment.

Accordingly, from the measurement by ESR, it can be said that the oxide semiconductor film (CAAC-OS film) according to one embodiment of the disclosed invention, which includes the c-axis-aligned crystalline region, is an oxide semiconductor film which does not show an ESR signal of oxygen vacancies.

This application is based on Japanese Patent Application serial no. 2011-089349 filed with Japan Patent Office on Apr. 13, 2011, the entire contents of which are hereby incorporated by reference.

What is claimed is:

1. A semiconductor device comprising:
    a substrate;
    a source electrode and a drain electrode over the substrate; and
    a semiconductor film between the source electrode and the drain electrode, the semiconductor film comprising a first semiconductor film and a second semiconductor film over the first semiconductor film,
    wherein a first material of the first semiconductor film has a different composition from a second material of the second semiconductor film,
    wherein the second semiconductor film has a higher crystallinity than the first semiconductor film,
    wherein each of the first material and the second material is an In—Ga—Zn—O-based metal oxide, and
    wherein the first material has a different composition ratio of In to Ga and Zn from the second material.

2. The semiconductor device according to claim 1, further comprising a gate electrode between the substrate and the semiconductor film.

3. The semiconductor device according to claim 1, further comprising a gate electrode over the semiconductor film.

4. The semiconductor device according to claim 1, wherein a composition of the first material is represented by $In_{1+\delta}Ga_{1-\delta}O_3(ZnO)_m$, and
    wherein $0<\delta<1$ and $m=1$ to 3 are satisfied.

5. The semiconductor device according to claim 1, wherein each of the first material and the second material is represented by $In_xGa_yO_3(ZnO)_m$ where $0<x<2$, $0<y<2$, and $m=1$ to 3 are satisfied.

6. An electronic appliance comprising the semiconductor device according to claim 1, wherein the electronic appliance is any one of a television set, a monitor, a camera, a video camera, a digital photo frame, a mobile phone handset, a game machine, an information terminal, an audio reproducing device and a display device.

7. A semiconductor device comprising:
    a substrate;
    a source electrode and a drain electrode over the substrate; and
    a semiconductor film between the source electrode and the drain electrode, the semiconductor film comprising a first semiconductor film and a second semiconductor film over the first semiconductor film,
    wherein a first material of the first semiconductor film has a different composition from a second material of the second semiconductor film,
    wherein each of the first semiconductor film and the second semiconductor film comprises crystals,
    wherein an alignment of the crystals of the second semiconductor film is higher than an alignment of the crystals of the first semiconductor film,
    wherein each of the first material and the second material is an In—Ga—Zn—O-based metal oxide, and
    wherein the first material has a different composition ratio of In to Ga and Zn from the second material.

8. The semiconductor device according to claim 7, further comprising a gate electrode between the substrate and the semiconductor film.

9. The semiconductor device according to claim 7, further comprising a gate electrode over the semiconductor film.

10. The semiconductor device according to claim 7, wherein a composition of the first material is represented by $In_{1+\delta}Ga_{1-\delta}O_3(ZnO)_m$, and
    wherein $0<\delta<1$ and $m=1$ to 3 are satisfied.

11. The semiconductor device according to claim 7, wherein an alignment of c-axes of the crystals of the second semiconductor film is higher than an alignment of each of a-axes and b-axes of the crystals of the second semiconductor film.

12. A semiconductor device comprising:
    a substrate; and
    a semiconductor film including a channel formation region over the substrate, the semiconductor film comprising a first semiconductor film and a second semiconductor film over the first semiconductor film,
    wherein a first material of the first semiconductor film has a different composition from a second material of the second semiconductor film,
    wherein the second semiconductor film has a higher crystallinity than the first semiconductor film,
    wherein each of the first material and the second material is an In—Ga—Zn—O-based metal oxide, and
    wherein the first material has a different composition ratio of In to Ga and Zn from the second material.

13. The semiconductor device according to claim 12, further comprising a gate electrode between the substrate and the semiconductor film.

14. The semiconductor device according to claim 12, further comprising a gate electrode over the semiconductor film.

15. The semiconductor device according to claim 12, wherein a composition of the first material is represented by $In_{1+\delta}Ga_{1-\delta}O_3(ZnO)_m$, and
    wherein $0<\delta<1$ and $m=1$ to 3 are satisfied.

16. The semiconductor device according to claim 12, wherein each of the first semiconductor film and the second semiconductor film comprises crystals, and
    wherein an alignment of the crystals of the second semiconductor film is higher than an alignment of the crystals of the first semiconductor film.

17. The semiconductor device according to claim 16, wherein an alignment of c-axes of the crystals of the second semiconductor film is higher than an alignment of each of a-axes and b-axes of the crystals of the second semiconductor film.

* * * * *